(12) United States Patent
Kitano et al.

(10) Patent No.: US 9,793,434 B2
(45) Date of Patent: Oct. 17, 2017

(54) LED ELEMENT AND METHOD OF MANUFACTURING THE SAME

(71) Applicant: EL-SEED CORPORATION, Nagoya-shi (JP)

(72) Inventors: Tsukasa Kitano, Nagoya (JP); Midori Mori, Nagoya (JP); Toshiyuki Kondo, Nagoya (JP); Atsushi Suzuki, Nagoya (JP); Koichi Naniwae, Nagoya (JP); Masaki Ohya, Nagoya (JP)

(73) Assignee: EL-SEED CORPORATION, Nagoya-Shi, Aichi (JP)

( * ) Notice: Subject to any disclaimer, the term of this patent is extended or adjusted under 35 U.S.C. 154(b) by 0 days.

(21) Appl. No.: 14/784,936

(22) PCT Filed: Apr. 15, 2014

(86) PCT No.: PCT/JP2014/060763
§ 371 (c)(1),
(2) Date: Oct. 15, 2015

(87) PCT Pub. No.: WO2014/171467
PCT Pub. Date: Oct. 23, 2014

(65) Prior Publication Data
US 2016/0149076 A1 May 26, 2016

(30) Foreign Application Priority Data

Apr. 16, 2013 (JP) .................. 2013-086049
Apr. 16, 2013 (JP) .................. 2013-086050
Apr. 16, 2013 (JP) .................. 2013-086051

(51) Int. Cl.
*H01L 33/00* (2010.01)
*H01L 33/10* (2010.01)
(Continued)

(52) U.S. Cl.
CPC ............ *H01L 33/10* (2013.01); *H01L 33/005* (2013.01); *H01L 33/20* (2013.01); *H01L 33/26* (2013.01);
(Continued)

(58) Field of Classification Search
CPC ................. H01L 33/10; H01L 33/62
See application file for complete search history.

(56) References Cited

U.S. PATENT DOCUMENTS

2008/0303042 A1 12/2008 Minato et al.
2012/0228656 A1 9/2012 Kamiyama et al.

FOREIGN PATENT DOCUMENTS

CN 102484183 A 5/2012
JP 2008-177528 A1 7/2008
(Continued)

OTHER PUBLICATIONS

International Search Report (ISR) (PCT Form PCT/ISA/210), in PCT/JP2014/060763, dated Jun. 24, 2014.
(Continued)

*Primary Examiner* — Tran Tran
(74) *Attorney, Agent, or Firm* — McGinn IP Law Group, PLLC

(57) ABSTRACT

An LED element capable of further improving the light extraction efficiency and its manufacturing method are provided.
An LED element comprises a semiconductor lamination part that includes a light-emitting layer, a diffractive surface on which light emitted from the light-emitting layer is incident and on which projection parts are formed with a period larger than an optical wavelength of the light and smaller than a coherence length of the light and which reflects the incident light in a plurality of modes according to a Bragg diffraction condition and transmits the incident light in a
(Continued)

plurality of modes according to the Bragg diffraction condition, and a reflecting surface that reflects light refracted by the diffractive surface so that the reflected light is incident on the diffractive surface again, wherein the semiconductor lamination part is formed on the diffractive surface without any void around the projection parts and a proportion of a flat part in the diffractive surface is 40% or more in a plan view thereof.

16 Claims, 27 Drawing Sheets

(51) Int. Cl.
*H01L 33/20* (2010.01)
*H01L 33/46* (2010.01)
*H01L 33/26* (2010.01)
*H01L 33/40* (2010.01)

(52) U.S. Cl.
CPC .............. *H01L 33/40* (2013.01); *H01L 33/46* (2013.01); *H01L 33/405* (2013.01); *H01L 2933/0025* (2013.01); *H01L 2933/0033* (2013.01); *H01L 2933/0091* (2013.01)

(56) References Cited

FOREIGN PATENT DOCUMENTS

JP          2010-74090 A       4/2010
WO     WO 2011/027679 A1     3/2011

OTHER PUBLICATIONS

Notification of Reason(s) for refusal dated Aug. 12, 2014 (an office action of related Japanese application), and its English translation.
Chinese Office Action dated Jun. 21, 2017, with an English translation.

F I G. 1
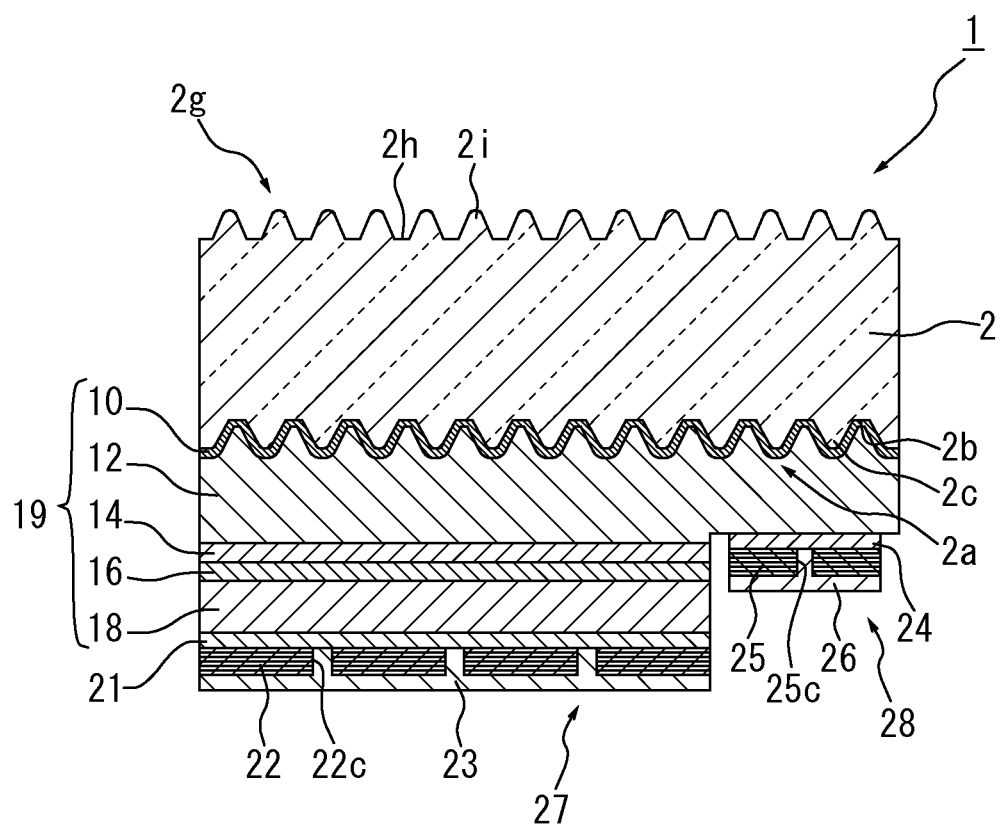

FIG. 7
(a)
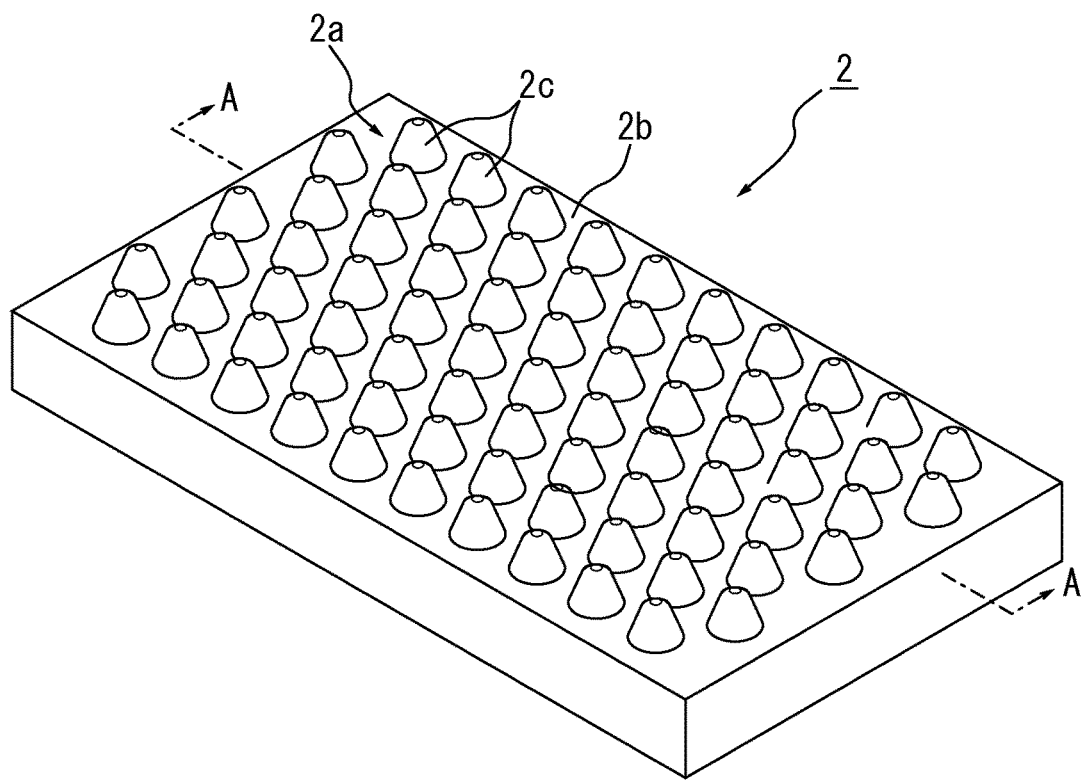
(b)
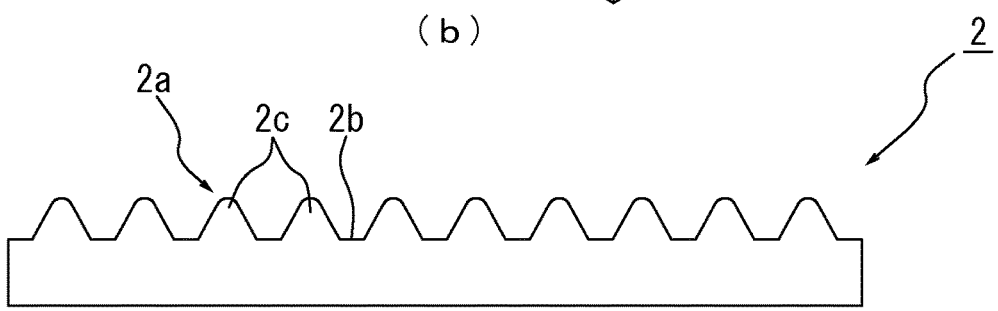
(c)
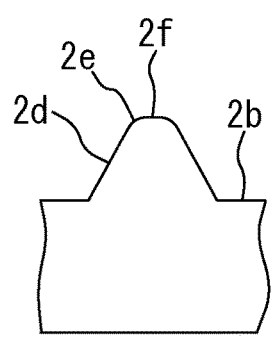

F I G. 8
(a)
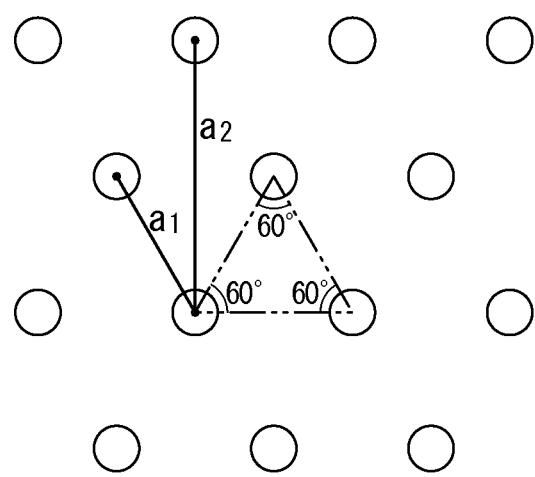
(b)
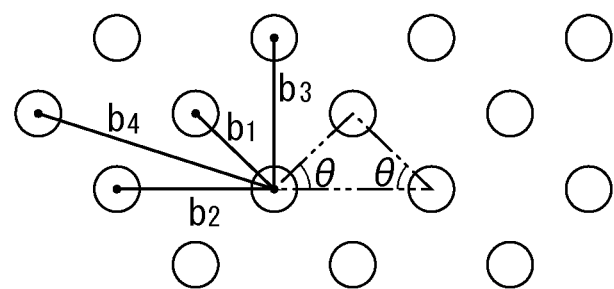

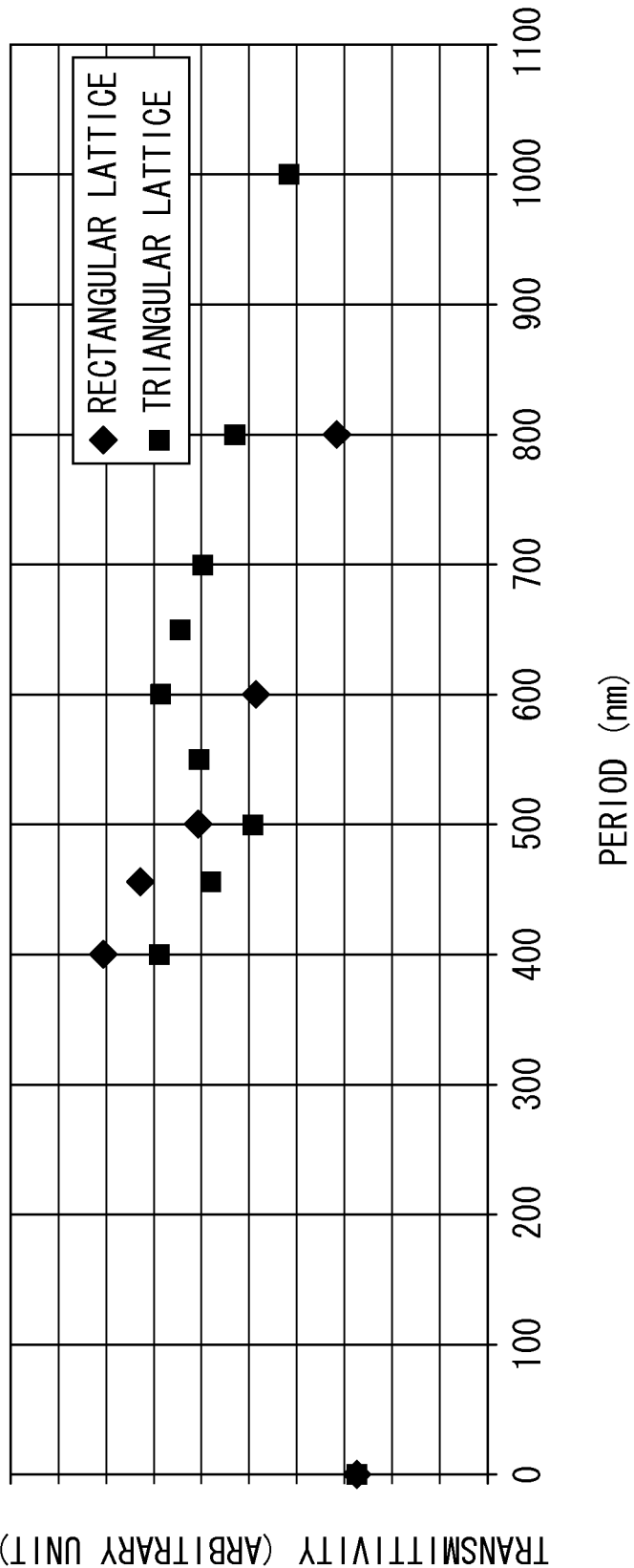

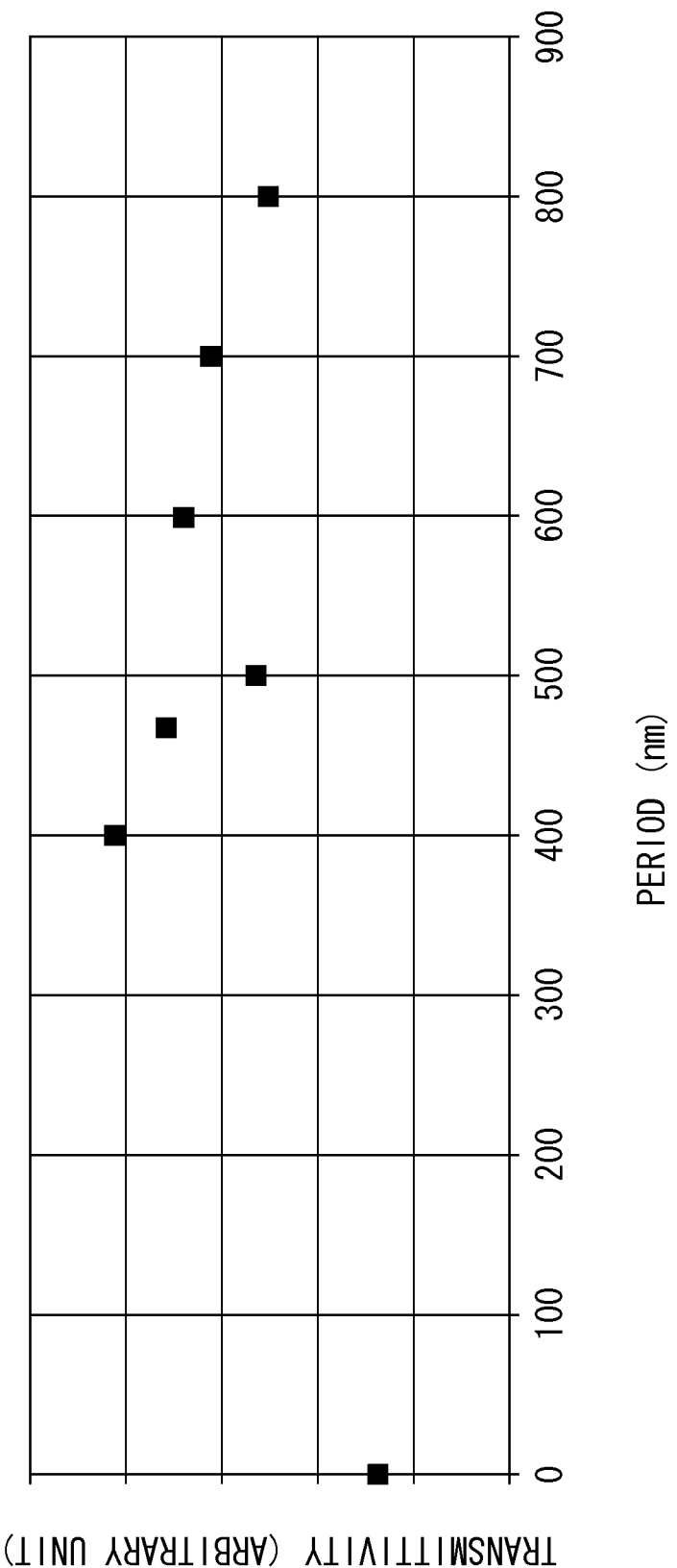

F I G. 1 1
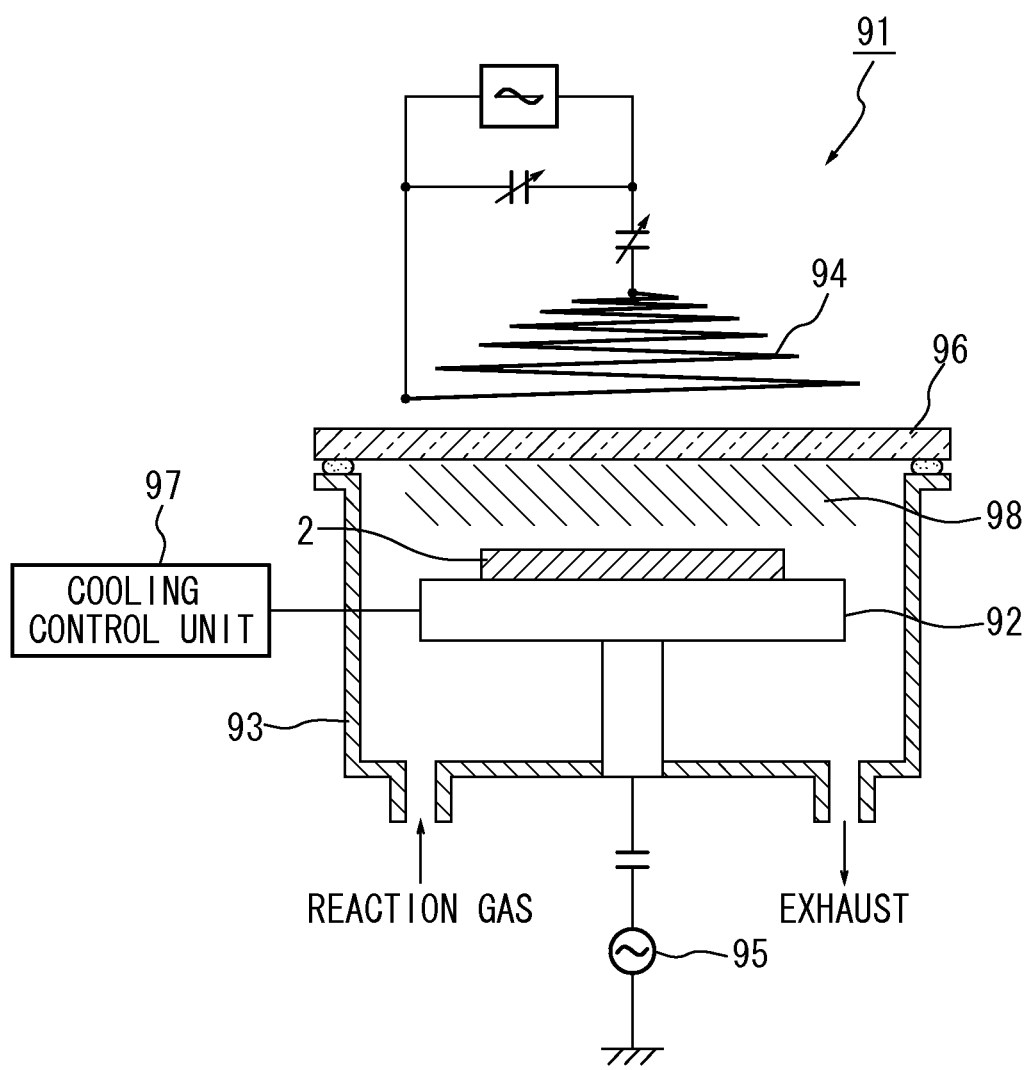

F I G. 1 3 A
(a) 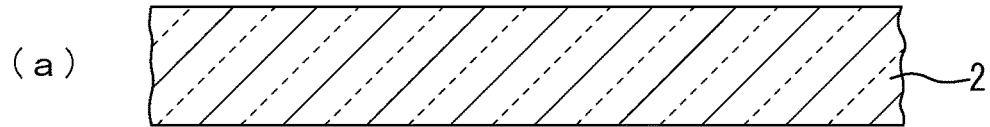
(b) 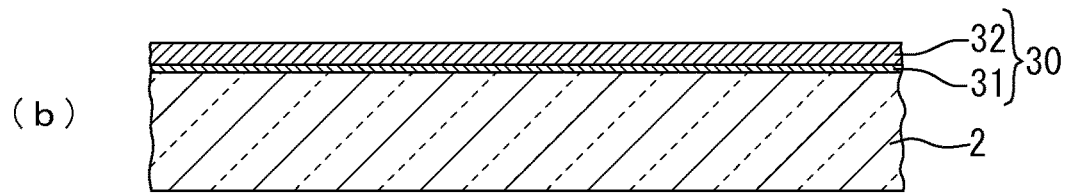
(c) 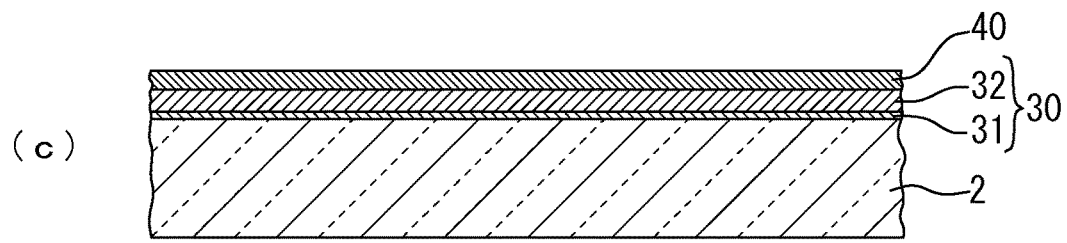
(d) 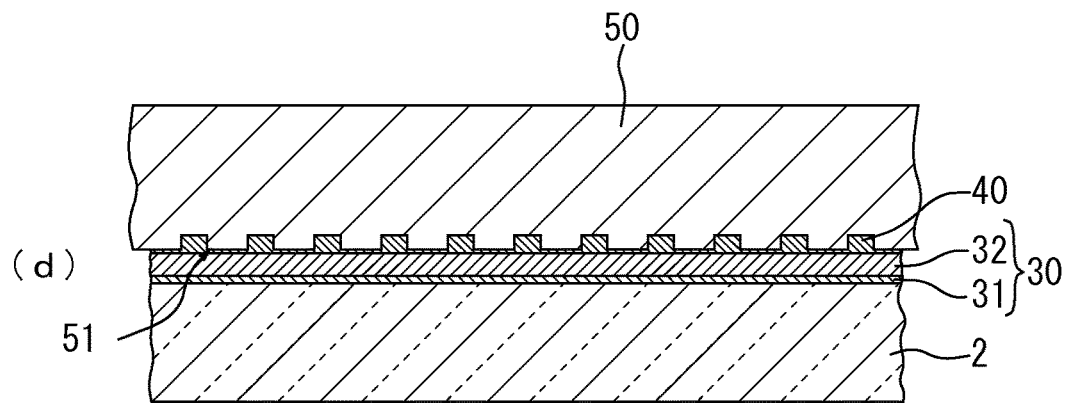
(e) 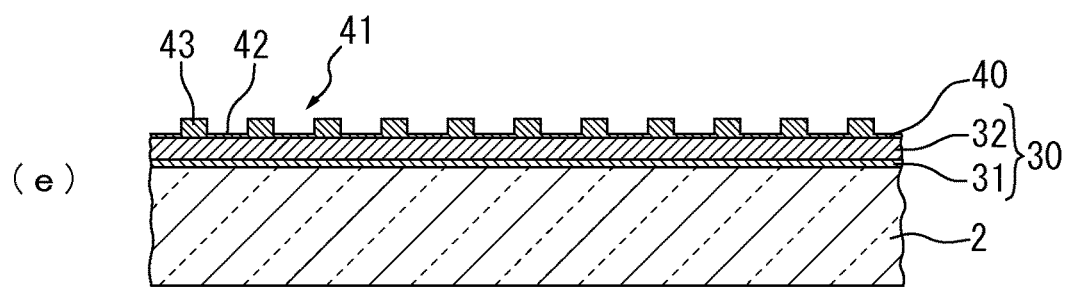

F I G. 1 3 C
(j)
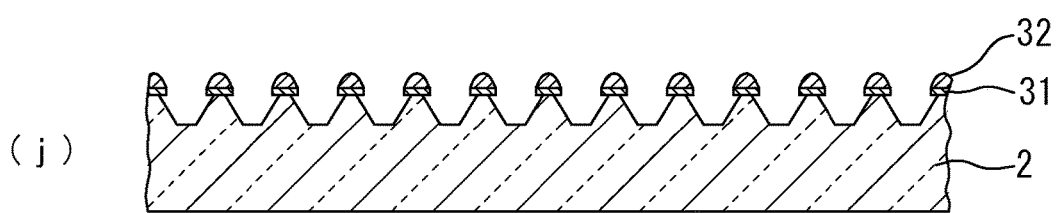
(k)
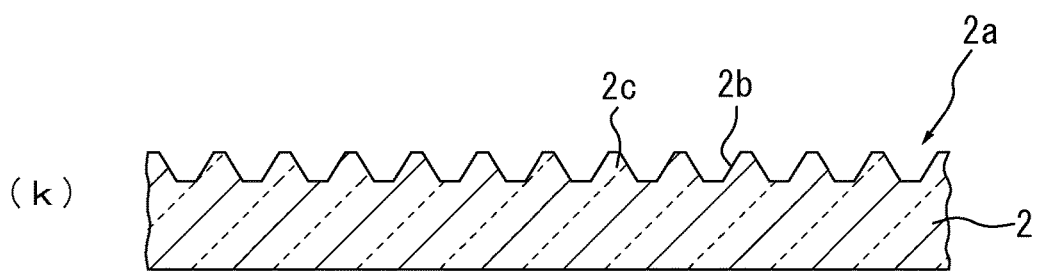
(l)
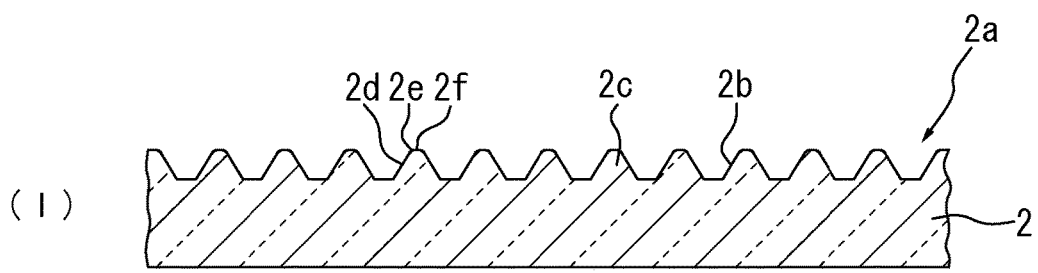

F I G. 1 5

| C-SURFACE AREA / PERIOD | 34% | 35% | 41% | 45% | 47% | 63% | 65% | 69% | 72% | 76% |
|---|---|---|---|---|---|---|---|---|---|---|
| 460nm | | × | ○ | | ○ | | | | | |
| 600nm | ○ | | | ○ | | | ○ | | | |
| 800nm | | | | | | ○ | | ○ | ○ | ○ |

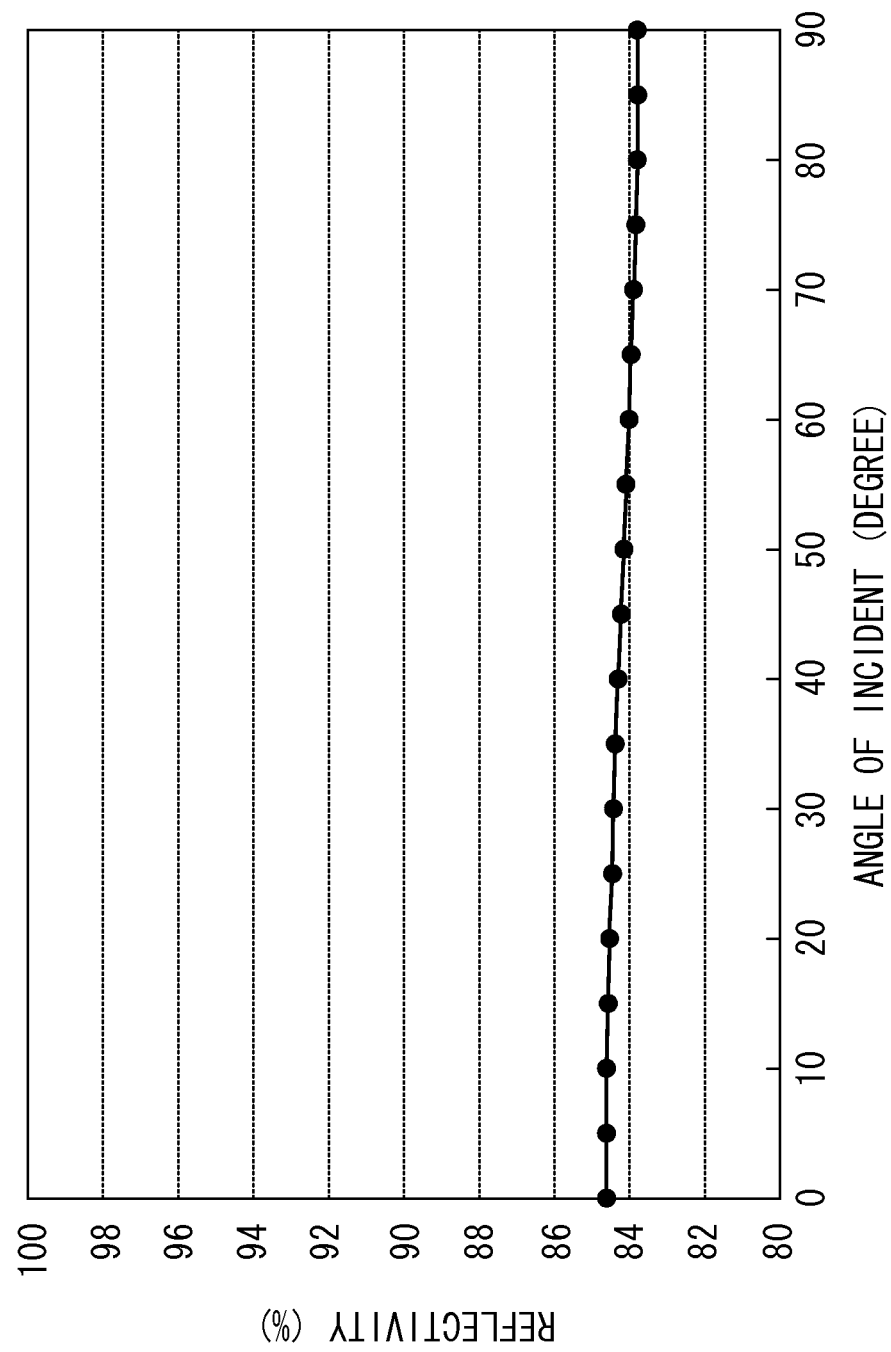
F I G. 17

LED ELEMENT AND METHOD OF MANUFACTURING THE SAME

TECHNICAL FIELD

The present invention relates to an LED element and its manufacturing method.

BACKGROUND ART

An LED element provided with a group III nitride semiconductor that is formed on the front surface of a sapphire substrate and that includes a light-emitting layer, a diffraction surface that is provided on the front surface side of the sapphire substrate, that allows incidence of light emitted from the light-emitting layer, and that has depression parts or projection parts whose period is grater than an optical wavelength of the light and is smaller than coherent length of the light, and an Al reflection layer that is formed on the back surface side of the substrate, that causes the light diffracted at the diffraction surface to reflect and to be incident on the diffraction surface again is known (refer to Patent Literature 1). With this LED element, light transmitted by diffraction effect is incident on the diffraction surface again, and transmitted through the diffraction surface by using the diffraction effect again, so that the light can be extracted to the outside of the element in a plurality of modes.

CITATION LIST

Patent Literature

Patent Literature 1: WO2011/027679A1

SUMMARY OF INVENTION

Technical Problem

The present inventors have pursued further improvement in light extraction efficiency.

The present invention is made in view of the above-described circumstances, and its object is to provide an LED element capable of further improving the light extraction efficiency, and its manufacturing method.

Solution to Problem

In order to achieve the above-described object, the present invention provides an LED element including: a semiconductor lamination part that includes a light-emitting layer; a diffractive surface on which light emitted from the light-emitting layer is incident and on which projection parts are formed with a period larger than an optical wavelength of the light and smaller than a coherence length of the light and which reflects the incident light in a plurality of modes according to a Bragg diffraction condition and transmits the incident light in a plurality of modes according to the Bragg diffraction condition; and a reflecting surface that reflects light refracted by the diffractive surface so that the reflected light is incident on the diffractive surface again, wherein the semiconductor lamination part is formed on the diffractive surface without any void around the projection parts, and a proportion of a flat part in the diffractive surface is 40% or more in a plan view thereof.

Moreover, the present invention provides a method of manufacturing the LED element, the method including: a mask layer forming step of forming a mask layer on a front surface of a sapphire substrate; a resist film forming step of forming a resist film on the mask layer; a pattern forming step of forming a predetermined pattern on the resist film; a mask layer etching step of etching the mask layer using the resist film as a mask; a substrate etching step of etching the sapphire substrate using the etched mask layer as a mask to form the projection parts; and a semiconductor forming step of forming the semiconductor lamination part on the etched front surface of the sapphire substrate.

Further, the present invention provides an LED element including: a sapphire substrate; and a semiconductor lamination part including a light-emitting layer that is formed on a front surface of the sapphire substrate so as to emit blue light, wherein the front surface of the sapphire substrate has a plurality of depression parts or projection parts disposed at the intersections of virtual triangular or rectangular lattices in a plan view thereof, and the triangles or rectangles that form the virtual triangular or rectangular lattice do not have a regular polygonal shape and the length of each side is larger than twice the optical wavelength of the blue light and smaller than the coherence length.

Further, the present invention provides an LED element including: a substrate; a semiconductor lamination part that includes a light-emitting layer formed on a front surface of the substrate; a reflecting portion formed on a back surface of the substrate; and an electrode formed on the semiconductor lamination part, wherein the electrode includes a diffusion electrode layer formed on the semiconductor lamination part and a moth-eye layer which is formed on the diffusion electrode layer and of which the front surface forms the transmissive moth-eye surface having depression parts or projection parts formed with a period smaller than twice the optical wavelength of the light emitted from the light-emitting layer, and the moth-eye layer is formed of a material which has a smaller extinction coefficient than a material that forms the diffusion electrode layer with respect to the light emitted from the light-emitting layer and has approximately the same index of refraction as the material that forms the diffusion electrode layer.

Advantageous Effects of Invention

With the LED element according to the present invention, it is possible to further improve the light extraction efficiency.

BRIEF DESCRIPTION OF DRAWINGS

FIG. 1 is a schematic sectional view of an LED element according to a first embodiment of the present invention;

FIG. 7 illustrate the sapphire substrate, in which (a) is a schematic perspective view, (b) is a schematic explanatory view taken along the A-A line, and (c) is a schematic enlarged explanatory view FIG. 8 is a schematic plan view illustrating an arrangement state of projection parts, in which (a) illustrates a state where a virtual triangular lattice has a regular triangular shape and (b) illustrates a state where a virtual triangular lattice has an isosceles triangular shape;

FIG. 9 is a graph illustrating the relation between the length of one side and the light extraction efficiency when a virtual triangular lattice or a rectangular lattice has a regular polygonal shape;

FIG. 10 is a graph illustrating the relation between the length of equilateral sides and the light extraction efficiency when a virtual triangular lattice has an isosceles triangular shape;

FIG. 11 is a schematic explanatory view of a plasma etching apparatus;

FIG. 13A illustrate processes of the etching method of the sapphire substrate and a mask layer, in which (a) illustrates the sapphire substrate before processing, (b) illustrates the state where the mask layer is formed on the sapphire, (c) illustrates the state where a resist film is formed on the mask layer, (d) illustrates the state where a mold is brought into contact with the resist film, and (e) illustrates the state where a pattern is formed on the resist film;

FIG. 13C illustrate processes of the etching method of the sapphire substrate and the mask layer, in which (j) illustrates the state where the sapphire substrate is etched further by using the mask layer as a mask, (k) illustrates the state where the remaining mask layer is removed from the sapphire substrate, and (l) illustrates the state where the sapphire substrate is subjected to wet-etching;

FIG. 15 is a table illustrating the period of projection parts, the proportion of a C-surface area, and whether dislocation density is equal to or smaller than a predetermined value;

FIG. 17 is a graph illustrating the reflectivity of a reflection part according to an example 2;

DESCRIPTION OF EMBODIMENTS

Figure 2:
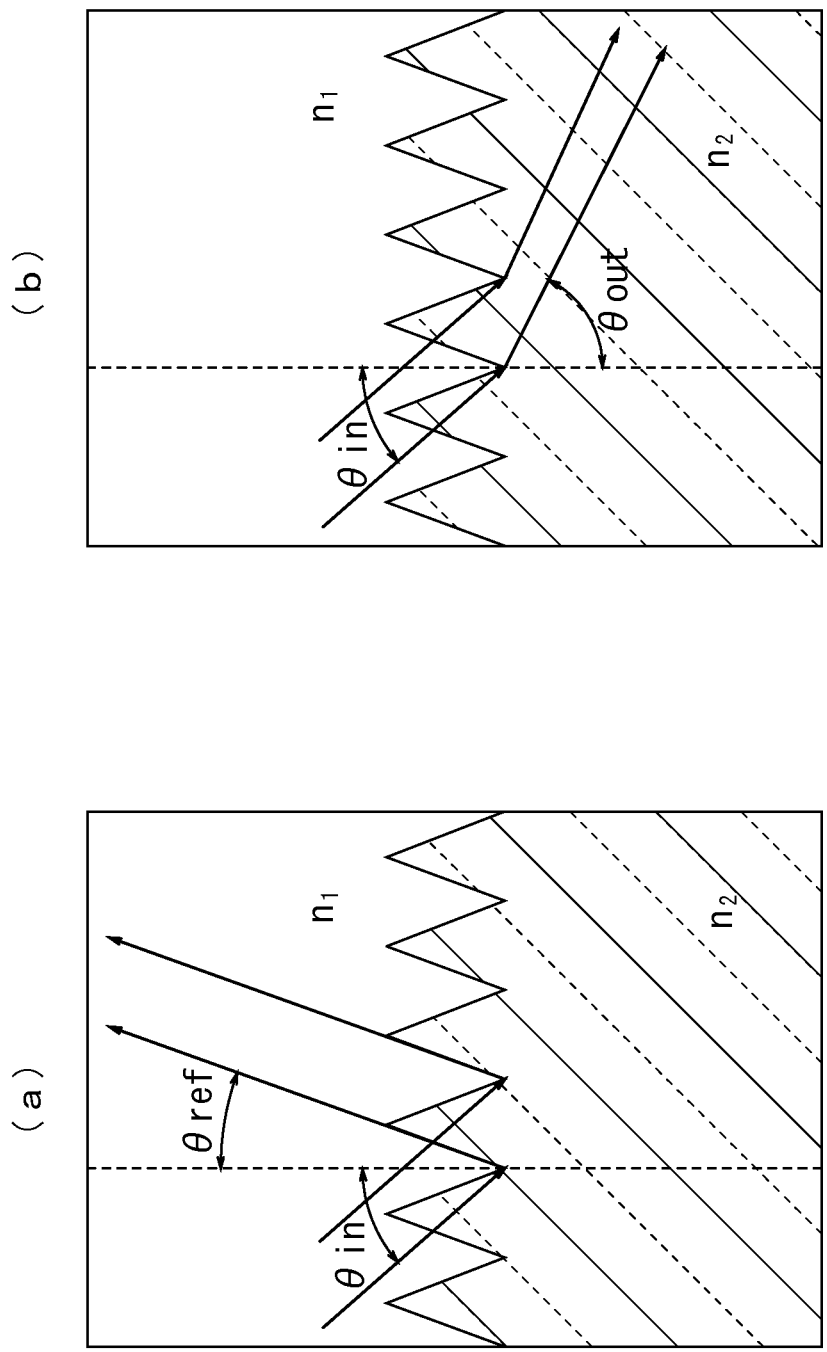
FIG. 2 are explanatory views illustrating diffraction effect of light at interfaces having different indices of refraction, in which (a) illustrates the state where reflection is made at the interface, and (b) illustrates the state where transmission is made through the interface.

FIG. 1 is a schematic sectional view of an LED element according to a first embodiment of the present invention.

In an LED element 1, as illustrated in FIG. 1, a semiconductor lamination part 19, formed by a group III nitride semiconductor layer, is formed on the front surface of a sapphire substrate 2. This LED element 1 is a flip-chip type, and light is mainly extracted from the back surface side of the sapphire substrate 2. The semiconductor lamination part 19 has a buffer layer 10, an n-type GaN layer 12, a light-emitting layer 14, an electron blocking layer 16, and a p-type GaN layer 18 in this order from the sapphire substrate 2 side. A p-side electrode 27 is formed on the p-type GaN layer 18, and an n-side electrode 28 is formed on the n-type GaN layer 12.

As illustrated in FIG. 1, the buffer layer 10 is formed on the front surface of the sapphire substrate 2 and is formed by MN. According to this embodiment, the buffer layer 10 is formed by an MOCVD (Metal Organic Chemical Vapor Deposition) method, but may be formed by a sputtering method. The n-type GaN layer 12, as a first conductivity type layer, is formed on the buffer layer 10 and is formed by n-GaN. The light-emitting layer 14 is formed on the n-type GaN layer 12, formed by GaInN/GaN, and emits blue light by electron and hole injection. Here, the blue light means light whose peak wavelength is 430 nm or more and 480 nm or less, for example. According to this embodiment, the peak wavelength of light emitted from the light-emitting layer 14 is 450 nm.

The electron blocking layer 16 is formed on the light-emitting layer 14, and is formed by p-AlGaN. The p-type GaN layer 18, as a second conductivity type layer, is formed on the electron blocking layer 16, and is formed by p-GaN. The n-type GaN layer 12 to the p-type GaN layer 18 are formed by epitaxial growth of the group III nitride semiconductor, and projection parts 2c are periodically formed on the front surface of the sapphire substrate 2. However, at the beginning of growth of the group III nitride semiconductor, planarization by lateral growth is made. Incidentally, the semiconductor layer may be constituted freely as long as it includes at least the first conductivity type layer, an active layer, and the second conductivity type layer, and it emits light from the active layer by recombination of the electron and the hole when a voltage is applied to the first conductivity type layer and the second conductivity type layer.

The front surface of the sapphire substrate 2 forms a verticalizing moth-eye surface 2a, and the back surface of the sapphire substrate 2 forms a transmissive moth-eye surface 2g. A flat part 2b and a plurality of projection parts 2c that are periodically formed on the flat part 2b are formed on the front surface of the sapphire substrate 2. In the present embodiment, the semiconductor lamination part 19 is formed around each projection part 2c without any void. Examples of the shape of each projection part 2c include a pyramidal shape such as a conical shape or a polygonal pyramidal shape and a truncated pyramidal shape obtained by cutting the top of a pyramid such as a truncated conical shape or a truncated polygonal pyramidal shape. Each projection part 2c is designed to diffract light emitted from the light-emitting layer 14. In the present embodiment, the light verticalizing effect can be obtained by the projection parts 2c disposed periodically. Here, the light verticalizing effect means an effect by which light intensity distribution after the light is reflected from and transmitted through the verticalizing moth-eye surface is inclined closer to the direction vertical to the interface between the sapphire substrate 2 and the semiconductor lamination part 19 than before the light is incident on the verticalizing moth-eye surface.

In addition, on the back surface of the sapphire substrate 2, a flat part 2h and a plurality of projection parts 2i that are periodically formed on the flat part 2h are formed. The shape of each projection part 2i may be a pyramid shape such as a cone, a polygonal pyramid or the like, or may be a truncated pyramid shape, as a pyramid whose upper portion is cut off, such as a truncated cone, a truncated polygonal pyramid or the like. A period of the projection parts 2i on the transmission moth-eye surface is smaller than a period of the projection parts 2c on the verticalized moth-eye surface. According to this embodiment, the respective projection parts 2i, arranged periodically, suppress Fresnel reflection at the interface with the outside.

FIG. 2 are explanatory views illustrating diffraction effect of light at interfaces having different indices of refraction, in which (a) illustrates the state where reflection is made on the interface, and (b) illustrates the state where transmission is made through the interface.

Here, from the Bragg diffraction condition, the condition to be satisfied by the angle of reflection $\theta_{ref}$ with respect to the angle of incident $\theta_{in}$ at the time when light is reflected on the interface is as follows.

$$d \times n1 \times (\sin \theta_{in} - \sin \theta_{ref}) = m \times \lambda \quad (1)$$

Wherein n1 is an index of refraction of a medium on the incident side, $\lambda$, is a wavelength of incident light, and m is an integer. When light is incident on the sapphire substrate 2 from the semiconductor lamination part 19, n1 is the index of refraction of the group III nitride semiconductor. As illustrated in FIG. 2(a), light being incident on the interface is reflected at the angle of reflection $\theta_{ref}$ that satisfies the above-described expression (1).

Meanwhile, from the Bragg diffraction condition, the condition to be satisfied by the angle of transmission $\theta_{out}$ with respect to the angle of incident $\theta_{in}$ at the time when light is transmitted through the interface is as follows.

$$d \times (n1 \times \sin \theta_{in} - n2 \times \sin \theta_{out}) = m' \times \lambda \quad (2)$$

Wherein n2 is an index of refraction of a medium on the output side, and m' is an integer. When, for example, light is incident on the sapphire substrate 2 from the semiconductor lamination part 19, n2 is the index of refraction of sapphire. As illustrated in FIG. 2(b), the light being incident on the interface is transmitted at the angle of transmission $\theta_{out}$ satisfying the above-described expression (2).

For the existence of the angle of reflection $\theta_{ref}$ and the angle of transmission $\theta_{out}$ satisfying the diffraction conditions of the above-described expressions (1) and (2), the period on the front surface of the sapphire substrate 2 needs to be greater than ($\lambda$/n1) and ($\lambda$/n2) as optical wavelengths in the element. Therefore, the period on the front surface of the sapphire substrate 2 is set to be greater than ($\lambda$/n1) and ($\lambda$/n2) so that diffraction light exists.

Figure 3:
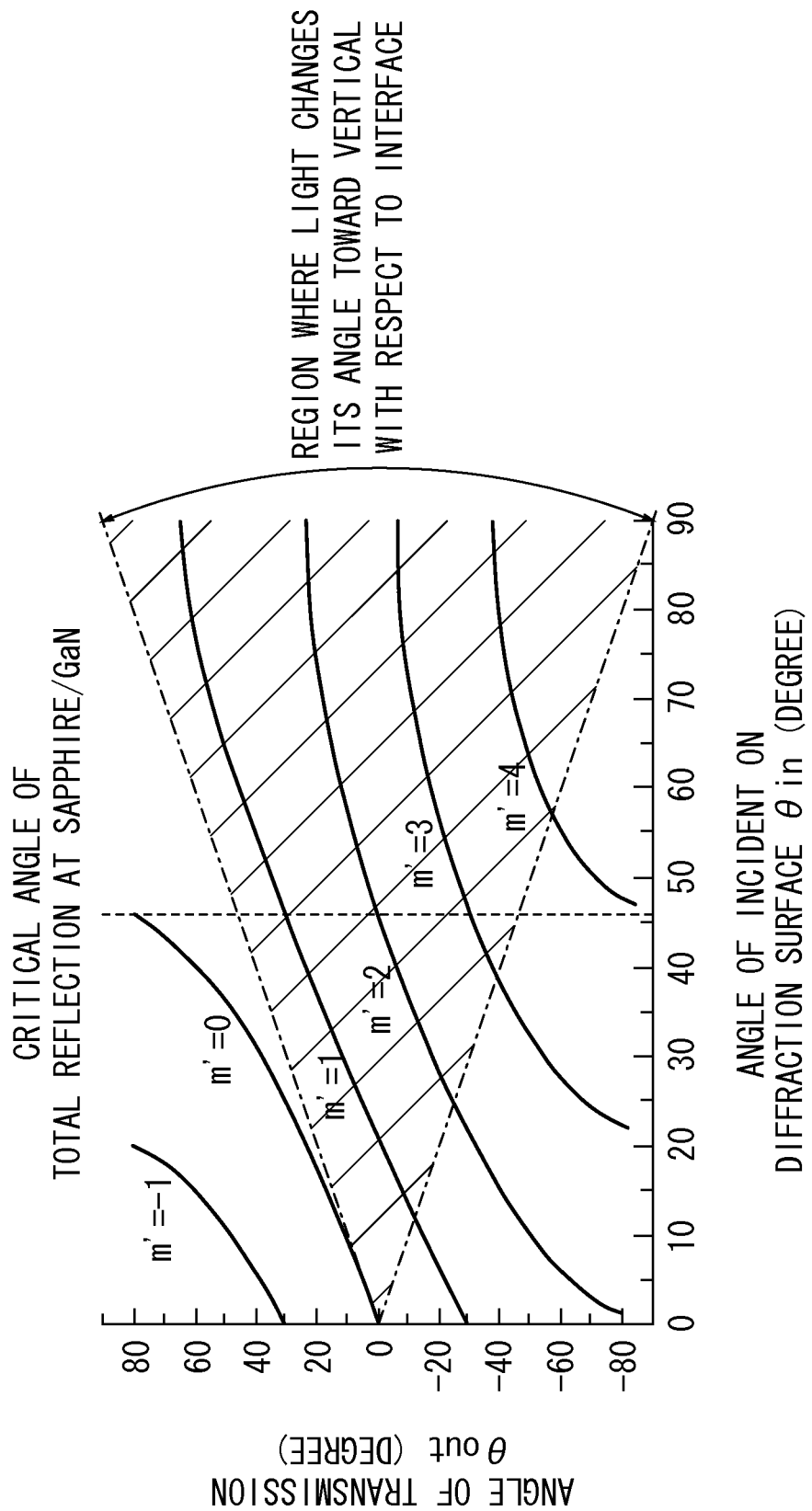
FIG. 3 is a graph illustrating the relationship between the angle of incident light being incident on the interface from the side of a semiconductor layer and the angle of transmission at the interface by diffraction effect, at the interface between a group III nitride semiconductor layer and a sapphire substrate, when a period of depression parts or projection parts is set as 500 nm.
Figure 4:
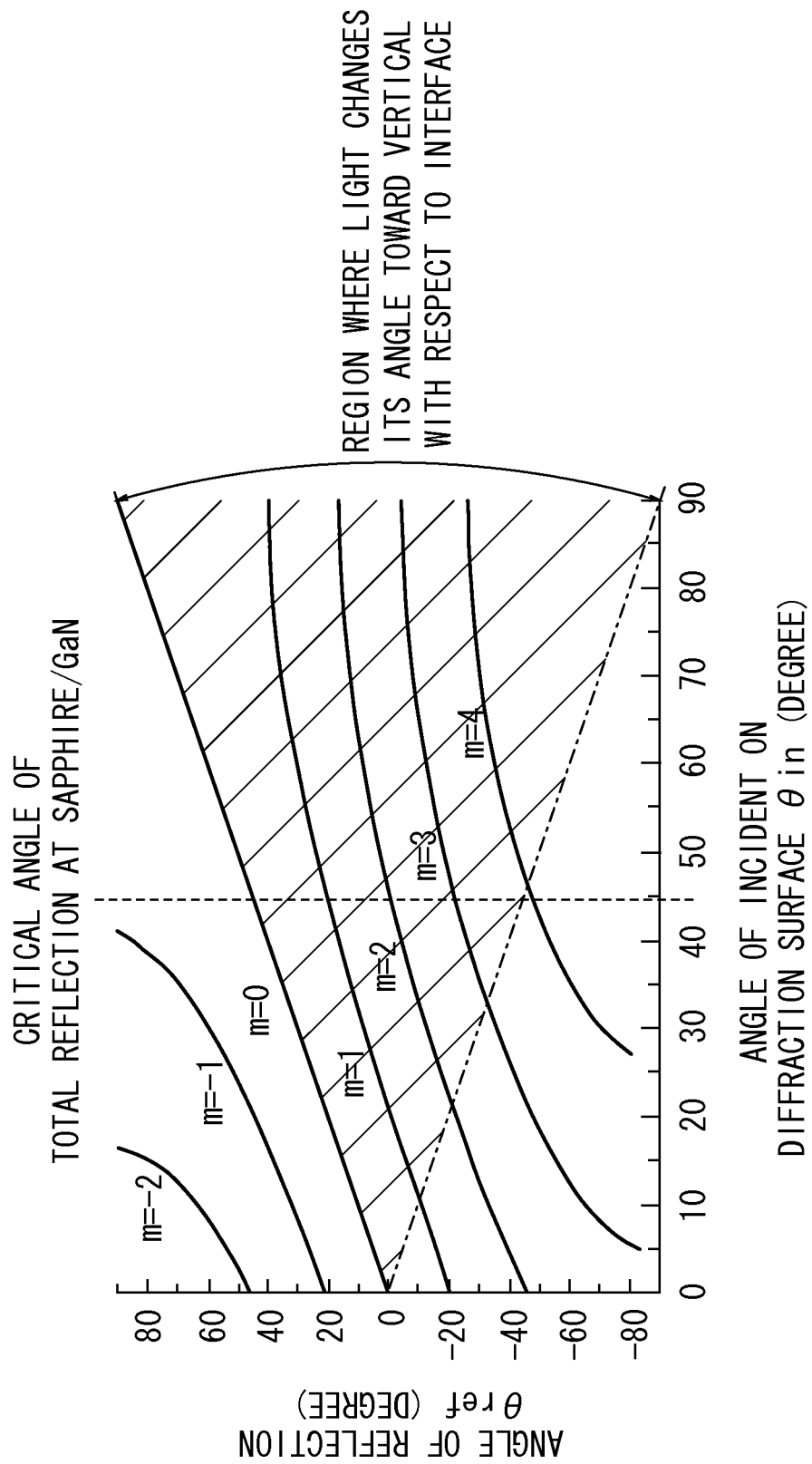
FIG. 4 is a graph illustrating the relationship between the angle of incident light being incident on the interface from the side of the semiconductor layer and the angle of reflection at the interface by the diffraction effect, at the interface between the group III nitride semiconductor layer and the sapphire substrate, when the period of the depression parts or the projection parts is set as 500 nm.

FIG. 3 is a graph illustrating the relationship between the angle of incident light being incident on the interface from the semiconductor layer side and the angle of transmission at the interface by the diffraction effect, at the interface between the group III nitride semiconductor layer and the sapphire substrate, when a period of the depression parts or the projection parts is set as 500 nm. In addition, FIG. 4 is a graph illustrating the relationship between the angle of incident light being incident on the interface from the semiconductor layer side and the angle of reflection at the interface by the diffraction effect, at the interface between the group III nitride semiconductor layer and the sapphire substrate, when the period of the depression parts or the projection parts is set as 500 nm.

As with the general flat surfaces, light being incident on the verticalized moth-eye surface 2a has the critical angle of total reflection. The critical angle at the interface between the GaN-based semiconductor layer and the sapphire substrate 2 is 45.9°. In the region exceeding the critical angle, as illustrated in FIG. 3, transmission in diffraction modes of m'=1, 2, 3, and 4, satisfying the diffraction condition of the above-described expression (2), is possible. In addition, in the region exceeding the critical angle, as illustrated in FIG. 4, reflection in diffraction modes of m=1, 2, 3, and 4, satisfying the diffraction condition of the above-described expression (1), is possible. When the critical angle is 45.9°, light output exceeding the critical angle is about 70%, and light output not exceeding the critical angle is about 30%. Namely, extraction of light in the region exceeding the critical angle greatly contributes to improvement of light extraction efficiency of the LED element 1.

In the region where the angle of transmission $\theta_{out}$ is smaller than the angle of incident $\theta_{in}$, light that transmits through the verticalized moth-eye surface 2a changes its angle toward the vertical with respect to the interface between the sapphire substrate 2 and the group III nitride semiconductor layer. This region is hatched in FIG. 3. As illustrated in FIG. 3, in the region exceeding the critical angle, light that transmits through the verticalized moth-eye surface 2a and that is in the diffraction modes of m'=1, 2, and 3 changes its angle toward the vertical in all angle regions. Although the light in the diffraction mode of m'=4 does not change its angle toward the vertical in a part of the angle regions, it has not so much influence as intensity of light having a greater diffraction order is relatively small, and substantially, the light also changes its angle toward the vertical in this part of the angle regions. Namely, the intensity distribution of the light transmitting through and extracted from the verticalized moth-eye surface 2a on the sapphire substrate 2 side is inclined to the direction closer to the vertical with respect to the interface between the semiconductor lamination part 19 and the sapphire substrate 2, as compared with the intensity distribution of the light being incident on the verticalized moth-eye surface 2a on the semiconductor lamination part 19 side.

In the region where the angle of reflection $\theta_{ref}$ is smaller than the angle of incident $\theta_{in}$, light that is reflected on the verticalized moth-eye surface 2a changes its angle toward the vertical with respect to the interface between the sapphire substrate 2 and the group III nitride semiconductor layer. This region is hatched in FIG. 4. As illustrated in FIG. 4, in the region exceeding the critical angle, light that is reflected on the verticalized moth-eye surface 2a and that is in the diffraction modes of m=1, 2, and 3 changes its angle toward the vertical in all angle regions. Although the light in the diffraction mode of m=4 does not change its angle toward the vertical in a part of the angle regions, it has not so much influence as intensity of light having a greater diffraction order is relatively small, and substantially, the light also changes its angle toward the vertical in this part of the angle regions. Namely, the intensity distribution of the light that is extracted, by reflection, from the verticalized moth-eye surface 2a on the semiconductor lamination part 19 side is inclined to the direction closer to the vertical with respect to the interface between the semiconductor lamination part 19 and the sapphire substrate 2, as compared with the intensity distribution of the light being incident on the verticalized moth-eye surface 2a on the semiconductor lamination part 19 side.

Figure 5:
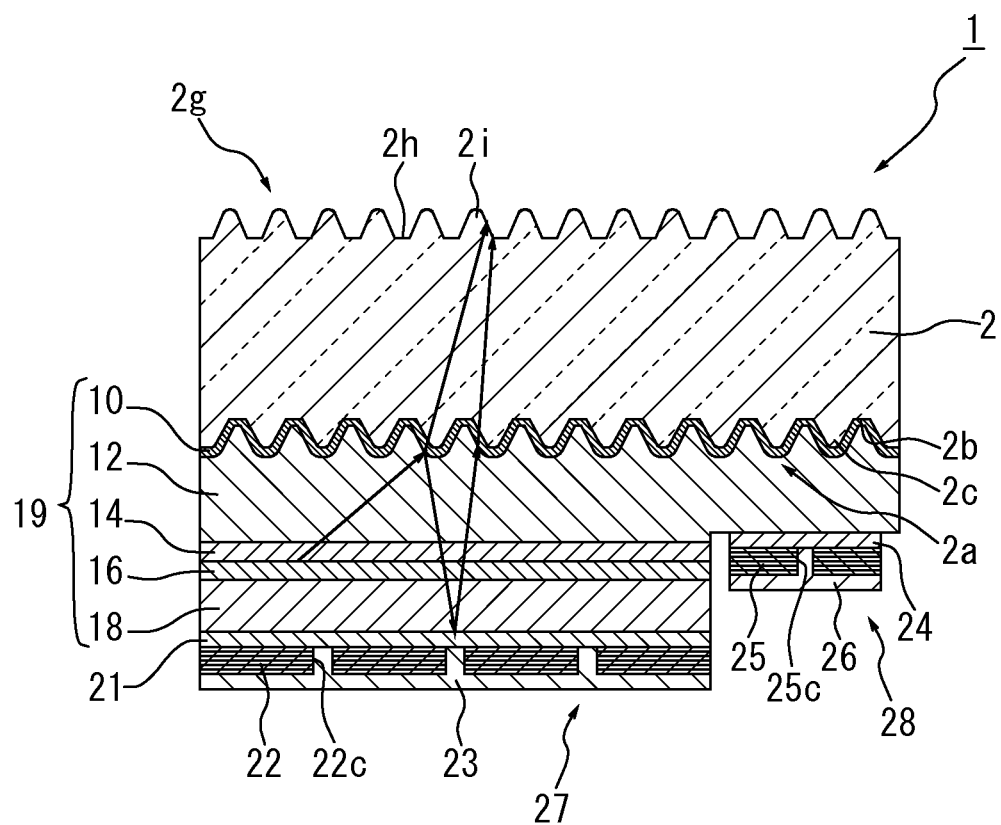
FIG. 5 is an explanatory view illustrating the traveling direction of light in the element.

FIG. 5 is an explanatory view illustrating the traveling direction of light in the element.

As illustrated in FIG. 5, light being incident on the sapphire substrate 2 by exceeding the critical angle, among light emitted from the light-emitting layer 14, is transmitted through and reflected on the the verticalized moth-eye surface 2a toward the direction closer to the vertical, as compared with the direction when it is incident on the verticalized moth-eye surface 2a. Namely, light that transmits through the verticalized moth-eye surface 2a is incident on the transmission moth-eye surface 2g by changing its angle toward the vertical. Further, light that is reflected on the verticalized moth-eye surface 2a, whose angle is changed toward the vertical, is reflected on the p-side electrode 27 and the n-side electrode 28, and thereafter, is incident on the verticalized moth-eye surface 2a again. The angle of incident at this time is closer to the vertical than the angle of incident. As a result of this, light being incident on the transmission moth-eye surface 2g can be directed toward the vertical.

Figure 6:
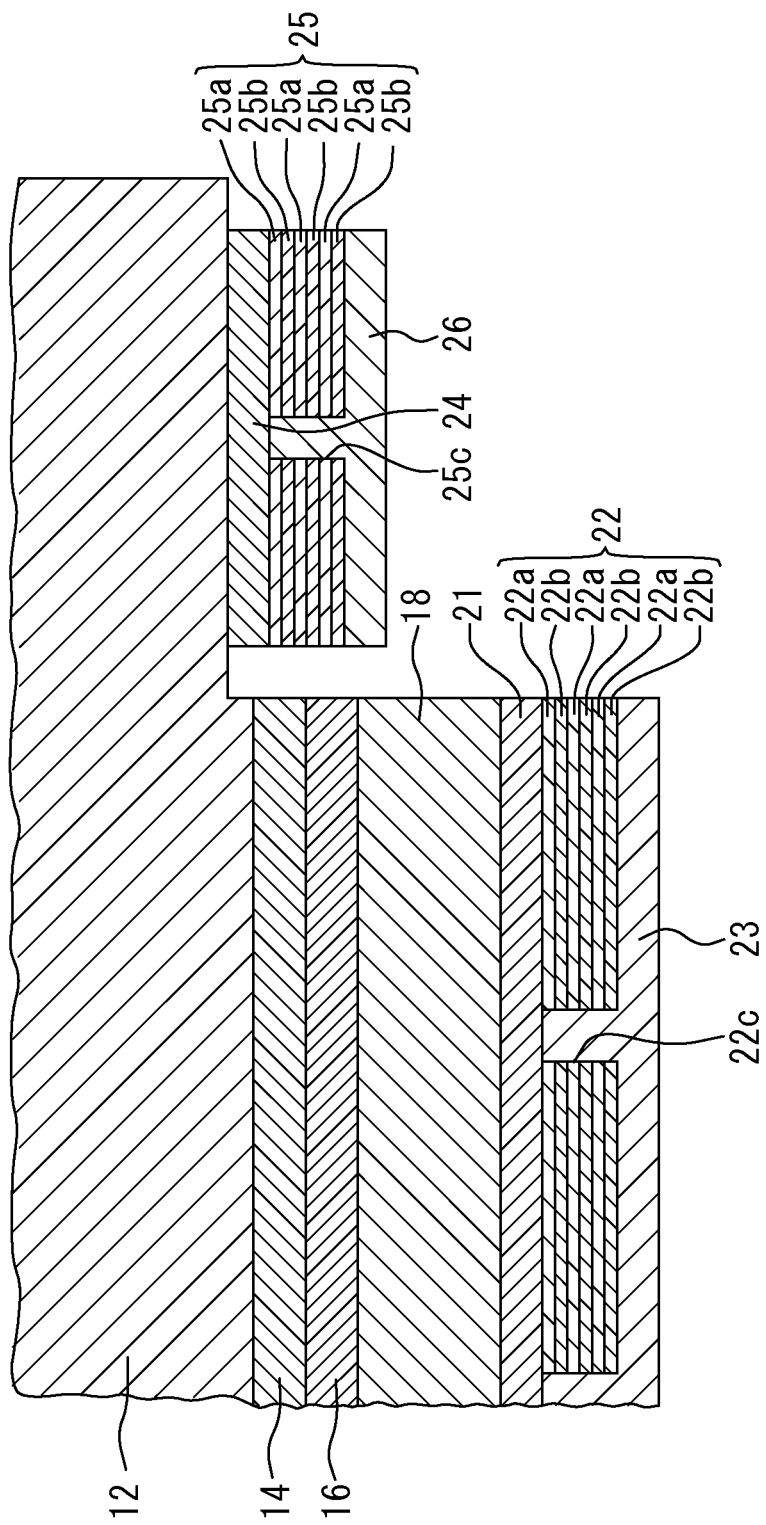
FIG. 6 is a partially enlarged schematic sectional view of the LED element.

FIG. 6 is a partially enlarged schematic sectional view of the LED element.

As illustrated in FIG. 6, the p-side electrode 27 includes a diffusion electrode 21 that is formed on the p-type GaN layer 18, a dielectric multilayer film 22 that is formed on the predetermined region on the diffusion electrode 21, and a metal electrode 23 that is formed on the dielectric multilayer film 22. The diffusion electrode 21 is formed entirely on the p-type GaN layer 18, and is formed by a transparent material such as ITO (Indium Tin Oxide), for example. The dielectric multilayer film 22 is formed by repeating a plurality of pairs of a first material 22a and a second material 22b, having different indices of refraction. For example, the dielectric multilayer film 22 may have five pairs of the first material 22a of $ZrO_2$ (index of refraction: 2.18) and the second material 22b of $SiO_2$ (index of refraction: 1.46). It should be noted that materials other than $ZrO_2$ and $SiO_2$ may be used to form the dielectric multilayer film 22, and MN (index of refraction: 2.18), $Nb_2O_3$ (index of refraction: 2.4), $Ta_2O_3$ (index of refraction: 2.35) or the like may be used, for example. The metal electrode 23 covers the dielectric multilayer film 22, and is formed by a metal material such as Al, for example. The metal electrode 23 is electrically connected to the diffusion electrode 21 through a via hole 22c formed in the dielectric multilayer film 22.

As illustrated in FIG. 6, the n-side electrode 28 is formed on the n-type GaN layer 12 exposed after etching the p-type GaN layer 18 to the n-type GaN layer 12. The n-side electrode 28 includes a diffusion electrode 24 that is formed on the n-type GaN layer 12, a dielectric multilayer film 25 that is formed on the predetermined region on the diffusion electrode 24, and a metal electrode 26 that is formed on the dielectric multilayer film 25. The diffusion electrode 24 is formed entirely on the n-type GaN layer 12, and is formed by a transparent material such as ITO (Indium Tin Oxide), for example. The dielectric multilayer film 25 is formed by repeating a plurality of pairs of a first material 25a and a second material 25b, having different indices of refraction. For example, the dielectric multilayer film 25 may have five pairs of the first material 25a of $ZrO_2$ (index of refraction: 2.18) and the second material 25b of $SiO_2$ (index of refraction: 1.46). It should be noted that materials other than $ZrO_2$ and $SiO_2$ may be used to form the dielectric multilayer film 25, and MN (index of refraction: 2.18), $Nb_2O_3$ (index of refraction: 2.4), $Ta_2O_3$ (index of refraction: 2.35) or the like may be used, for example. The metal electrode 26 covers the dielectric multilayer film 25, and is formed by a metal material such as Al, for example. The metal electrode 26 is electrically connected to the diffusion electrode 24 through a via hole 25a formed in the dielectric multilayer film 25.

In this LED element 1, the p-side electrode 27 and the n-side electrode 28 form a reflection part. Reflectivity of the p-side electrode 27 and the n-side electrode 28 becomes higher as the angle comes closer to the vertical. Light that is reflected on the verticalized moth-eye surface 2a of the sapphire substrate 2 and changes its angle toward the vertical with respect to the interface, as well as light emitted from the light-emitting layer 14 and being incident thereon directly, is incident on the reflection part. Namely, the intensity distribution of light being incident on the reflection part is inclined to the direction closer to the vertical, as compared with the case where the front surface of the sapphire substrate 2 forms the flat surface.

Next, the sapphire substrate 2 will be described in detail with reference to FIG. 7. FIG. 7 illustrate the sapphire substrate, in which (a) is a schematic perspective view, (b) is a schematic explanatory view taken along with the A-A line, and (c) is a schematic enlarged explanatory view.

As illustrated in FIG. 7(a), the verticalizing moth-eye surfaces 2a are formed so as to be aligned at the intersections of virtual triangular lattices with a predetermined period so that the centers of the respective projection parts 2c are positioned at the vertices of regular triangles in a plan view thereof. The projection parts 2c may be disposed so that the centers of the projection parts 2c are positioned at the vertices of isosceles triangles. The period of the respective projection parts 2c is larger than an optical wavelength of the light emitted from the light-emitting layer 14 and is smaller than the coherence length of the light. It should be noted that the period means the distance between the peak height positions of the adjacent projection parts 2c. Further, the optical wavelength means a value obtained by dividing an actual wavelength by the index of refraction. Further, the coherence length corresponds to the distance in which periodic vibrations of waves cancel each other due to a difference between individual wavelengths of a group of photons having a predetermined spectrum width so that coherence disappears. The coherence length lc satisfies a relation of lc=($\lambda^2/\Delta\lambda$) in which the wavelength of light is $\lambda$ and a half-value width of the light is $\Delta\lambda$. When the period of the respective projection parts 2c is one or more times larger than the optical wavelength, the diffraction effect gradually and effectively starts acting on the incident light having the angle of the critical angle or more. When the period is two or more times larger than the optical wavelength of the light emitted from the light-emitting layer 14, the number of transmission modes and reflection modes increases sufficiently, which is favorable. Moreover, it is preferable that the period of the respective projection parts 2c is smaller than half the coherence length of the light emitted from the light-emitting layer 14.

In the present embodiment, the length of one side of the regular triangles that form the virtual triangular lattice is 460 nm. That is, the main period of the respective projection parts 2c is 460 nm and 797 nm. Moreover, the sapphire substrate 2 is configured so that the proportion of the flat parts 2b is 40% or more in a plan view thereof. Since the wavelength of the light emitted from the light-emitting layer 14 is 450 nm and the index of refraction of the group-III nitride semiconductor layer is 2.4, the optical wavelength thereof is 187.5 nm. Further, since the half-value width of the light emitted from the light-emitting layer 14 is 27 nm, the coherence length of the light is 7500 nm. That is, the period of the verticalizing moth-eye surfaces 2a is larger than twice the optical wavelength of the light-emitting layer 14 and is equal to or smaller than half the coherence length.

FIG. 8 is a schematic plan view illustrating an arrangement state of projection parts, in which (a) illustrates a state where a virtual triangular lattice has a regular triangular shape and (b) illustrates a state where a virtual triangular lattice has an isosceles triangular shape.

Here, as illustrated in FIG. 8(a), when the virtual triangular lattice has a regular triangular shape, six projection parts 2c are present at an interval of 60° at the closest distance a1 from each projection part 2c. That is, as illustrated in FIG. 8(a), the closest projection parts 2c about a certain projection part 2c are positioned in the directions 0°, 60°, 120°, 180°, 240°, and 300°. Among these directions, the directions 0°, 60°, and 120° are equivalent to the directions 180°, 240°, and 300°, respectively.

Moreover, the projection parts 2c at the next closest distance a2 are positioned in the directions 30°, 90°, 150°, 210°, 270°, and 330°. Among these directions, the directions 30°, 90°, and 150° are equivalent to the directions 210°, 270°, and 330°, respectively. That is, when the virtual triangular lattice has a regular triangular shape, two types of periods of the distances a1 and a2 are mainly present.

On the other hand, as illustrated in FIG. 8(b), when the virtual triangular lattice has an isosceles triangular shape and the base angle of the isosceles triangle is $\theta$, the projection parts 2c positioned at the distance b1 of the equilateral sides from each projection part 2c are positioned in the directions $\theta$, $(180°-\theta)$, $(180°+\theta)$, and $(360°-\theta)$. Among these directions, the directions $\theta$ and $(180°-\theta)$ are equivalent to the directions $(180°+\theta)$ and $(360°-\theta)$, respectively.

Moreover, the projection parts 2c positioned at the distance b2 of the bottom side from each projection part 2c are positioned in the directions 0° and 180°. These directions are equivalent directions.

Further, the projection parts 2c positioned at the distance b3 of $(2 \times b1 \times \sin\theta)$ from each projection part 2c are positioned at the directions 90° and 270°. These directions are equivalent directions.

Further, the projection parts 2c positioned at the distance b4 of $((3/2 \times b2)^2 + (b1 \times \sin\theta)^2)^{1/2}$ from each projection part 2c are positioned in the directions $\text{Tan}^{-1}(b3/3 \times b2)$, $(180°-\text{Tan}^{-1}(b3/3 \times b2))$, $(180°+\text{Tan}^{-1}(b3/3 \times b2))$, and $(360°-\text{Tan}^{-1}(b3/3 \times b2))$. Among these directions, the directions $\text{Tan}^{-1}(b3/3 \times b2)$ and $(180°-\text{Tan}^{-1}(b3/3 \times b2))$ are equivalent to the directions $(180°+\text{Tan}^{-1}(b3/3 \times b2))$ and $(360°-\text{Tan}^{-1}(b3/3 \times b2))$, respectively.

That is, when the virtual triangular lattice has an isosceles triangular shape, four types of periods of the distances b1, b2, b3, and b4 are mainly present, and the number of diffraction modes which can be used for light extraction increases.

FIG. 9 is a graph illustrating the relation between the length of one side and the light extraction efficiency when a virtual triangular lattice or a rectangular lattice has a regular polygonal shape.

As illustrated in FIG. 9, the relation between the length of one side and the light extraction efficiency was calculated by simulation when the virtual triangular or rectangular lattice had a regular polygonal shape. Specifically, the wavelength of light was 450 nm, and the transmittivity of light from a GaN-based semiconductor to a sapphire substrate at the interface between the GaN-based semiconductor and the sapphire substrate was calculated.

The results showed that relatively satisfactory transmittivity was obtained for the virtual triangular lattice when the length of one side was 460 nm or smaller and between 550 nm and 800 nm. Moreover, relatively satisfactory transmittivity was obtained for the virtual rectangular lattice when the length of one side was 500 nm or smaller.

FIG. 10 is a graph illustrating the relation between the length of equilateral sides and the light extraction efficiency when a virtual triangular lattice has an isosceles triangular shape.

As illustrated in FIG. 10, the relation between the length of equilateral sides and the light extraction efficiency was calculated by simulation when the virtual triangular lattice had an isosceles triangular shape. Specifically, the length of the bottom side was 600 nm, the wavelength of light was 450 nm, and the transmittivity of light from a GaN-based semiconductor to a sapphire substrate at the interface between the GaN-based semiconductor and the sapphire substrate was calculated.

The results showed that relatively satisfactory transmittivity was obtained when the length of equilateral sides was 460 nm or smaller and between 550 nm and 800 nm similarly to the case where the virtual triangular lattice had a regular triangular shape.

Moreover, when the length of the equilateral sides of an isosceles triangle was the same as the length of one side of a regular triangle, higher transmittivity was obtained when the triangular lattice had an isosceles triangular shape than when the triangular lattice had a regular triangular shape. Specifically, the transmittivity increased by 4% when the length of the equilateral sides and one side was 400 nm, 5% when the length was 460 nm, 1% when the length was 500 nm, and 1% when the length was 700 nm. Since the length of the bottom side of the isosceles triangle was 600 nm, when the length of the equilateral sides was 600 nm, the same transmittivity as that of the regular triangular lattice was obtained. Moreover, when the length of the equilateral sides was 800 nm, approximately the same transmittivity as that of the regular triangular lattice whose side was 800 nm long was obtained.

From the above, it can be understood that higher light extraction efficiency is obtained for the virtual triangular lattice having the isosceles triangular shape than the virtual triangular lattice having the regular triangular shape. In this case, the length of the equilateral sides and the bottom side of the isosceles triangle is preferably 460 nm or smaller or between 550 nm and 800 nm. It can be also understood that the relation between the angle of incidence of light and the transmittivity in the length region of 460 nm or smaller is different from that in the length region between 550 nm and 800 nm. That is, further preferably, one of the length of the equilateral sides and the bottom side of the isosceles triangular is 460 nm or smaller and the length of the other is between 550 nm and 800 nm.

According to this embodiment, as illustrated in FIG. 7(c), each projection part 2c on the verticalized moth-eye surface 2a includes a side surface 2d that extends upward from the flat part 2b, a bent portion 2e that bends and extends from the upper end of the side surface 2d toward the center side of the projection part 2c, and a flat top surface 2f that is formed continuously from the bent portion 2e. As will be described later, before the formation of the bent portion 2e, the projection part 2c, on which a corner is formed at a portion associating the side surface 2d and the top surface 2f, is wet-etched and rounded, and thus the bent portion 2e is formed. The wet-etching may be made until the flat top surface 2f eliminates and the entire upper side of the projection part 2c becomes the bent portion 2e. Specifically, according to this embodiment, the diameter of the base end portion of each projection part 2c is 380 nm, and its height is 350 nm. In the verticalized moth-eye surface 2a of the sapphire substrate 2, the flat part 2b is provided at the position where the projection parts 2c are not provided, thus facilitating the lateral growth of the semiconductor Moreover, the transmissive moth-eye surfaces 2g on the back surface of the sapphire substrate 2 are formed so as to be aligned at the intersections of virtual triangular lattices with a predetermined period so that the centers of the respective projection parts 2i are positioned at the vertices of regular triangles in a plan view thereof. The shortest period of the projection parts 2i is smaller than twice the optical wavelength of the light emitted from the light-emitting layer 14. In the present embodiment, the length of one side of the regular triangles that form the virtual triangular lattice is 300 nm. That is, the shortest period of the projection parts 2i is 300 nm. Since the wavelength of the light emitted from the light-emitting layer 14 is 450 nm and the index of refraction of sapphire is 1.78, the optical wavelength thereof is 252.8 nm. That is, the shortest period of the transmissive moth-eye surfaces 2g is smaller than twice the optical wavelength of the light-emitting layer 14. When the period of the moth-eye surfaces is equal to or smaller than twice the optical wavelength, the Fresnel reflection at the interface can be suppressed. It is possible to sufficiently obtain the effect of suppressing the Fresnel reflection when the shortest period of the projection parts 2i is smaller than twice the optical wavelength. Moreover, it is possible to obtain a larger effect of suppressing the Fresnel reflection when all periods of the projection parts 2i are smaller than twice the optical wavelength. The effect of suppressing the Fresnel reflection increases as the period of the transmissive moth-eye surface 2g approaches one times from two times the optical wavelength. When the outside of the sapphire substrate 2 is resin or air, and when the period of the transmissive moth-eye surfaces 2g is equal to or smaller than 1.25 times the optical wavelength, it is possible to obtain approximately the same effect of suppressing the Fresnel reflection as when the period is one times or smaller than the optical wavelength.

Here, a method of manufacturing the sapphire substrate 2 for the LED element 1 will be explained with reference to FIG. 11 to FIG. 13C. FIG. 11 is a schematic explanatory view of a plasma etching apparatus for processing a sapphire substrate.

As illustrated in FIG. 11, a plasma etching apparatus 91 is an inductive coupling (ICP) type plasma etching apparatus and includes a flat plate-shaped substrate holding table 92 that holds the sapphire substrate 2, a container 93 that receives the substrate holding table 92, a coil 94 that is provided above the container 93 with a quartz plate 96 interposed, and a power supply 95 that is connected to the substrate holding table 92. The coil 94 has a solid spiral coil and supplies high-frequency power from the center of the coil and a terminating end at the outer periphery of the coil is grounded. The sapphire substrate 2 to be etched is placed on the substrate holding table 92 directly or with a carrier tray interposed. A cooling mechanism for cooling the sapphire substrate 2 is included in the substrate holding table 92 and is controlled by a cooling controller unit 97. The container 93 has a supply port through which various gases such as an $O_2$ gas, an Ar gas, and the like can be supplied.

When the etching is made by this plasma etching apparatus 1, the sapphire substrate 2 is placed on the substrate holding table 92 and then, air inside the container 93 is discharged to attain a decompressed state. The predetermined processing gas is supplied into the container 93, and gas pressure inside the container 93 is adjusted. Thereafter, high-output and high-frequency power is supplied to the coil 94 and the substrate holding table 92 for the predetermined period of time, and plasma 98 of a reaction gas is formed. This plasma 98 is used for etching the sapphire substrate 2.

Next, an etching method by using the plasma etching apparatus 91 will be explained with reference to FIG. 12, FIG. 13A, FIG. 13B and FIG. 13C.

Figure 12:
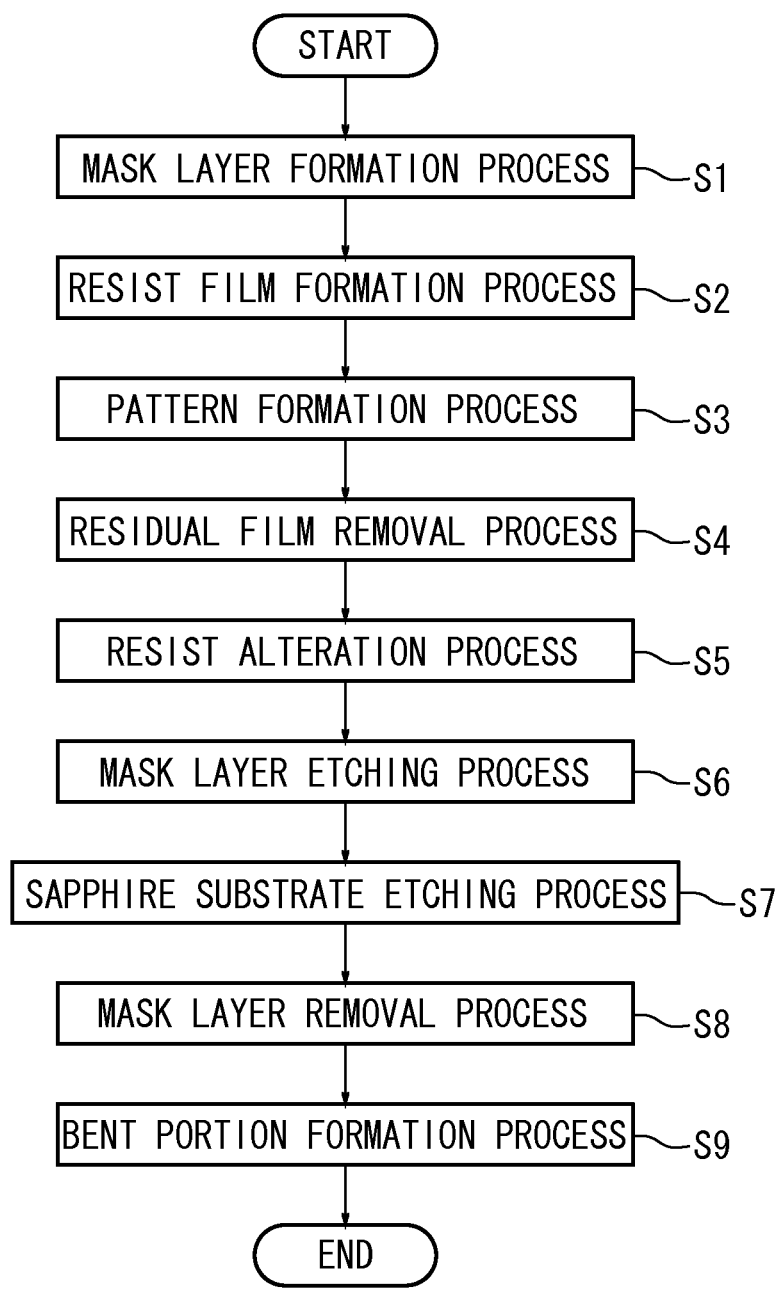
FIG. 12 is a flowchart illustrating an etching method of the sapphire substrate.

FIG. 12 is a flowchart illustrating the etching method. As illustrated in FIG. 12, the etching method according to this embodiment includes a mask layer formation process S1, a resist film formation process S2, a pattern formation process S3, a residual film removal process S4, a resist alteration process S5, a mask layer etching process S6, a sapphire substrate etching process S7, a mask layer removal process S8, and a bent portion formation process S9.

FIG. 13A illustrate processes of the etching method of the sapphire substrate and the mask layer, in which (a) illustrates the sapphire substrate before processing, (b) illustrates the state where the mask layer is formed on the sapphire substrate, (c) illustrates the state where a resist film is formed on the mask layer, (d) illustrates the state where a mold is brought into contact with the resist film, and (e) illustrates the state where a pattern is formed on the resist film.

Figure 13B:
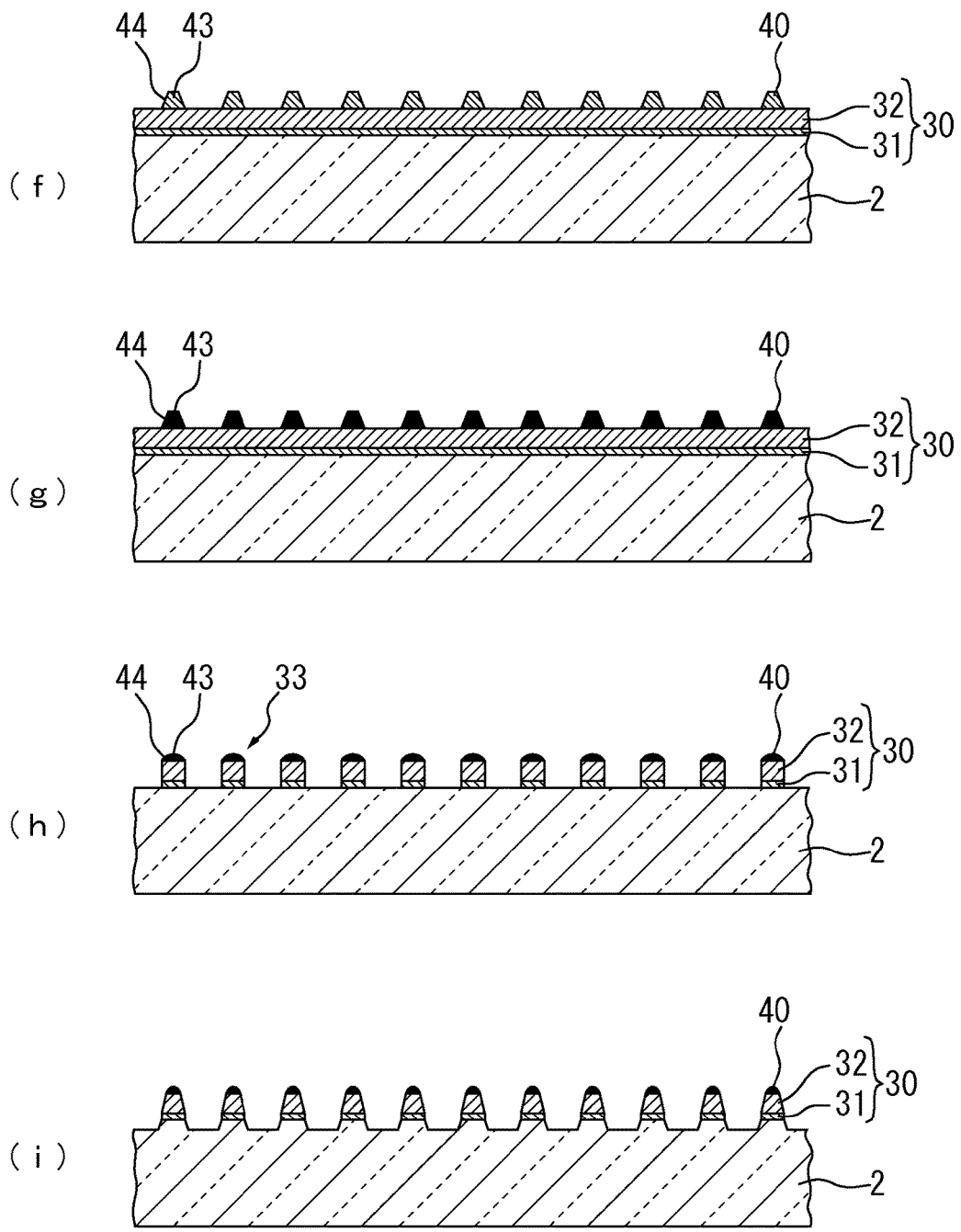
FIG. 13B illustrate processes of the etching method of the sapphire substrate and the mask layer, in which (f) illustrates the state where a residual film of the resist film is removed, (g) illustrates the state where the resist film is altered, (h) illustrates the state where the mask layer is etched by using the resist film as a mask, and (i) illustrates the state where the sapphire substrate is etched by using the mask layer as a mask.

FIG. 13B illustrate processes of the etching method of the sapphire substrate and the mask layer, in which (f) illustrates the state where a residual film of the resist film is removed, (g) illustrates the state where the resist film is altered, (h) illustrates the state where the mask layer is etched by using the resist film as a mask, and (i) illustrates the state where the sapphire substrate is etched by using the mask layer as a mask. It should be noted that the resist film after the alteration is filled in with black in the drawings.

FIG. 13C illustrate processes of the etching method of the sapphire substrate and the mask layer, in which (j) illustrates the state where the sapphire substrate is etched further by using the mask layer as a mask, (k) illustrates the state where the remaining mask layer is removed from the sapphire substrate, and (l) illustrates the state where the sapphire substrate is subjected to the wet-etching.

First, as illustrated in FIG. 13A(a), the sapphire substrate 2 before processing is provided. Prior to the etching, the sapphire substrate 2 is cleaned by the predetermined cleaning liquid. According to this embodiment, the sapphire substrate 2 is a substrate formed by sapphire.

Then, as illustrated in FIG. 13A(b), a mask layer 30 is formed on the sapphire substrate 2 (mask layer formation process: S1). According to this embodiment, the mask layer 30 includes a $SiO_2$ layer 31 on the sapphire substrate 2, and a Ni layer 32 on the $SiO_2$ layer 31. The thickness of each of the layers 31 and 112 may be freely set, but the $SiO_2$ layer may be set to have the thickness of 1 nm or more and 100 nm or less, and the Ni layer 32 may be set to have the thickness of 1 nm or more and 200 nm or less, for example. Incidentally, the mask layer 30 may have a single layer. The mask layer 30 is formed by the sputtering method, a vacuum deposition method, a CVD method, or the like.

Next, as illustrated in FIG. 13A(c), the resist film 40 is formed on the mask layer 30 (resist film formation process: S2). According to this embodiment, the resist film 40 is formed by thermoplastic resin, and is formed by a spin coating method to have the uniform thickness. The resist film 40 is formed by, for example, epoxy-based resin, and its thickness is 100 nm or more and 300 nm or less, for example. Incidentally, it is also possible to use photosetting resin as the resist film 40.

The resist film 40, together with the sapphire substrate 2, is heated and softened and, as illustrated in FIG. 13A(d), the resist film 40 is pressed by a mold 50. A projection-and-depression structure 51 is formed on the contact surface of the mold 50, and the resist film 40 is deformed along the projection-and-depression structure 51.

Thereafter, the resist film 40, while being pressed, is cooled and hardened, together with the sapphire substrate 2. The mold 50 is then separated from the resist film 40 and, as illustrated in FIG. 10A(e), a projection-and-depression structure 41 is transferred to the resist film 40 (pattern formation process: S3). Here, the period of the projection-and-depression structure 41 is 1 μm or less. According to this embodiment, the period of the projection-and-depression structure 41 is 460 nm. Further, according to this embodiment, the diameter of a projection part 43 of the projection-and-depression structure 41 is 100 nm or more and 300 nm or less, and is 230 nm, for example. Furthermore, the height of the projection part 43 is 100 nm or more and 300 nm or less, and is 250 nm, for example. In this state, a residual film 42 is formed on a depression part of the resist film 40.

The sapphire substrate 2, on which the resist film 40 is formed as described above, is mounted on the substrate holding table 92 of the plasma etching apparatus 1. Then, the residual film 42 is removed by plasma ashing, for example, and the mask layer 30, as the material to be processed, is exposed, as illustrated in FIG. 13B(f) (residual film removal process: S4). According to this embodiment, the $O_2$ gas is used as the processing gas for the plasma ashing. At this time, the projection part 43 of the resist film 40 is subjected to the influence of the ashing, and a side surface 44 of the projection part 43 is tilted by the predetermined angle, not being vertical to the front surface of the mask layer 30.

Then, as illustrated in FIG. 13B(g), the resist film 40 is exposed to the plasma under an alteration condition, so as to alter the resist film 40 and increase etch selectivity (resist alteration process: S5). According to this embodiment, the Ar gas is used as the processing gas for altering the resist film 40. Further, with regard to the alteration condition according to this embodiment, bias output of the power supply 95 for guiding the plasma to the sapphire substrate 2 side is set to be lower than that of a later-described etching condition.

Then, the resist film 40, having the high etch selectivity after being exposed to the plasma under the etching condition, is used as a mask to etch the mask layer 30 as the material to be processed (mask layer etching process: S6). According to this embodiment, the Ar gas is used as the processing gas for etching the resist film 40. Thereby, as illustrated in FIG. 13B(h), a pattern 33 is formed on the mask layer 30.

With regard to the alteration condition and the etching condition, it is possible to change the processing gas, antenna output, the bias output and the like as appropriate, but it is preferable to change the bias output by using the same processing gas, as in this embodiment. Specifically, with regard to the alteration condition, the Ar gas is set as the processing gas, the antenna output of the coil 94 is set as 350 W, and the bias output of the power supply 95 is set as 50 W, as a result of which the hardening of the resist film 40 is observed. Further, with regard to the etching condition, the Ar gas is set as the processing gas, the antenna output of the coil 94 is set as 350 W, and the bias output of the power supply 95 is set as 100 W, as a result of which the etching of the mask layer 30 is observed. It should be noted that the hardening of the resist is possible when the antenna output is lowered and a gas flow rate is reduced, as well as when the bias output is lowered, with respect to the etching condition.

Next, as illustrated in FIG. 13B(i), the sapphire substrate 2 is etched by using the mask layer 30 as a mask (sapphire substrate etching process: S7). According to this embodiment, the etching is made while the resist film 40 remains on the mask layer 30. Further, plasma etching is made by using a chlorine-based gas, such as a $BCl_3$ gas, as the processing gas.

When the etching progresses, as illustrated in FIG. 13C(j), the verticalized moth-eye surface 2a is formed on the sapphire substrate 2. According to this embodiment, the height of the projection-and-depression structure on the verticalized moth-eye surface 2a is 350 nm. Incidentally, the height of the projection-and-depression structure may be increased to be greater than 350 nm. When the height of the projection-and-depression structure is relatively small, such as 300 nm, for example, the etching may be finished while the remaining resist film 40 exists, as illustrated in FIG. 13B(i).

According to this embodiment, side etching is facilitated by the $SiO_2$ layer 31 of the mask layer 30, and the side surface 2d of the projection part 2c on the verticalized moth-eye surface 2a is tilted. Further, a tilt angle of the side surface 43 of the resist film 40 can also control the state of the side etching. It should be noted that, when the mask layer 30 is made as a single layer of the Ni layer 32, the side surface 2d of the projection part 2c can be made almost vertical to the main surface.

Figure 14:
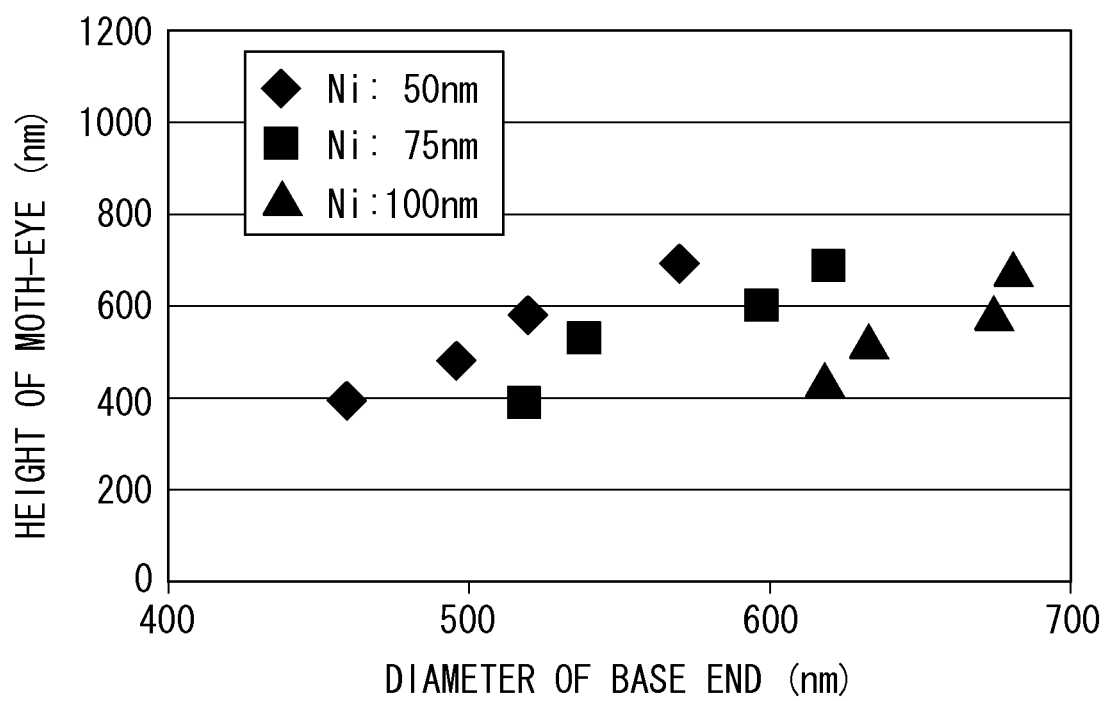
FIG. 14 is a graph illustrating the relation between the diameter of a base end of a projection part and the height of a projection part when the thickness of a Ni layer was changed.

Moreover, in the present embodiment, the size at the base end of the projection part 2c is controlled by the thickness of the Ni layer 32. The present inventors have found that the diameter at the base end of the projection part 2c can be adjusted by controlling the thickness of the Ni layer 32 as a metal mask. FIG. 14 is a graph illustrating the relation between the diameter of a base end of a projection part and the height of a projection part when the thickness of a Ni layer was changed. In this test, data was obtained by changing the thickness of the Ni layer 32 and the height of the projection part 2c while using the same mold 50. Specifically, three types of thicknesses of 50 nm, 75 nm, and 100 nm were used for the Ni layer 32, and four types of heights of 400 nm, 500 nm, 600 nm, and 700 nm were used for the projection part 2c. In some samples, the projection part 2c after etching did not have a desired height. As illustrated in FIG. 14, it can be understood that the thicker the Ni layer 32, the larger the diameter at the base end of the projection part 2c was obtained. In this way, it is possible to change the diameter at the base end of the projection part 2c without changing the mold 50.

Thereafter, as illustrated in FIG. 13C(k), the predetermined stripping liquid is used to remove the mask layer 30 remaining on the sapphire substrate 2 (mask layer removal process: S8). According to this embodiment, high-temperature nitric acid is used to remove the Ni layer 32, and then, hydrofluoric acid is used to remove the $SiO_2$ layer 31. When the resist film 40 remains on the mask layer 30, it can be removed together with the Ni layer 32 by the high-temperature nitric acid. However, when the remaining amount of the resist film 40 is large, it is preferable to remove the resist film 40 by $O_2$ ashing in advance.

Then, as illustrated in FIG. 13C(l), the corner on the projection part part 2c is removed by the wet-etching, so as to form the bent portion (bent portion formation process: S9). Although the etching solution can be freely selected, it is possible to use the so-called "hot phosphoric acid" as phosphoric acid aqueous solution that is heated to about 170° C., for example. Incidentally, this bent portion formation process can be omitted as appropriate. After the above-described processes, the sapphire substrate 2 having the projection-and-depression structure on its front surface is manufactured.

According to this etching method of the sapphire substrate 2, the alteration of the resist film 40 is made by exposing itself to the plasma, and thus the etching selectivity of the mask layer 30 and the resist film 40 can be improved. This makes it possible to facilitate the processing of the fine and deep pattern on the mask layer 30, and to form the mask layer 30, having the fine pattern, with enough thickness.

Further, the plasma etching apparatus 1 can alter the resist film 40 and etch the mask layer 30 in a continuous manner, without significantly increasing man-hour. According to this embodiment, the alteration of the resist film 40 and the etching of the mask layer 30 are made by changing the bias output of the power supply 95, which makes it possible to increase the selectivity of the resist film 40 with ease.

Furthermore, as the mask layer 30, having the enough thickness, is used as the mask to etch the sapphire substrate 2, the processing of the fine and deep pattern on the sapphire substrate 2 is facilitated. Especially, according to the etching method of this embodiment, it is possible to form the projection-and-depression structure having the period of 1 μm or less and the depth of 300 nm or more on the sapphire substrate, which has been impossible with the conventional etching method that forms the resist film on the substrate on which the mask layer is formed and that uses the resist film for etching the mask layer. Especially, the etching method according to this embodiment is suitable for forming the projection-and-depression structure having the period of 1 μm or less and the depth of 500 nm or more.

The nano-scaled periodic projection-and-depression structure is referred to as the moth-eye. When sapphire is subjected to this processing of the moth-eye, the processing is possible only to the depth of about 200 nm, as sapphire is a material that is difficult to grind. In some cases, however, difference in level of about 200 nm is not enough for the moth-eye. It is possible to say that the etching method according to this embodiment solves this new problem at the time when the sapphire substrate is subjected to the moth-eye processing.

It is needless to say that, although the mask layer 30 formed by $SiO_2$/Ni is presented as the material to be processed, the mask layer 30 may be a single layer of Ni or may be formed by other materials. What is required is to alter the resist and increase the etch selectivity of the mask layer 30 and the resist film 40.

In addition, the case of setting the alteration condition and the etching condition by changing the bias output of the plasma etching apparatus 1 is presented, but the setting may be made by changing the antenna output, the gas flow rate, or the processing gas, for example. What is required for the alteration condition is that the resist alters when being exposed to the plasma so as to increase the etch selectivity.

In addition, the mask layer 30 including the Ni layer 32 is presented, but it is needless to say that the present invention can be applied to the etching of other materials. The etching method of the sapphire substrate according to this embodiment can be applied to a substrate of SiC, Si, GaAs, GaN, InP, ZnO or the like.

The semiconductor lamination part 19 formed by the group III nitride semiconductor is formed by the epitaxial growth on thus-manufactured verticalized moth-eye surface 2a of the sapphire substrate 2 by using the lateral growth (semiconductor formation process), on which the p-side electrode 27 and the n-side electrode 28 are formed (electrode formation process). Thereafter, the projection parts 2i are formed on the back surface of the sapphire substrate 2 according to the same processes as those used for the verticalized moth-eye surface 2a on the front surface, which is diced and divided into a plurality of the LED elements 1. Thus, the LED element 1 is manufactured.

Here, the present inventors have examined whether dislocation density was equal to or smaller than a predetermined value when the proportion of the flat parts 2b of the sapphire substrate 2 was changed so that the semiconductor lamination part 19 had a predetermined thickness. Specifically, it was examined whether the dislocation density was equal to or smaller than $2\times10^8/cm^2$ when the flat part 2b was used as a C-surface and the period and the like of the projections 2c were changed so that the semiconductor lamination part 19 had a thickness of 2.5 μm. Samples which were formed so as to be aligned at the intersections of triangular lattices so that the projection parts 2c were positioned at the vertices of regular triangles were examined. The examination results are illustrated in FIG. 15. FIG. 15 is a table illustrating the period of the projection parts 2c, the proportion of the C-surface area, and whether dislocation density is equal to or smaller than a predetermined value. The period illustrated in FIG. 15 is a period corresponding to the length of one side of a regular triangle.

As illustrated in FIG. 15, it can be understood that the dislocation density is $2\times10^8/cm^2$ or smaller when the period of the projection parts 2c is 600 nm or more. It can be also understood that the dislocation density is $2\times10^8/cm^2$ or smaller when the proportion of the flat part 2b is 41% or more even if the period is 460 nm. That is, satisfactory crystal quality is obtained even when the semiconductor lamination part 19 is thin by setting the period of the projection parts 2c to 600 nm or more or setting the proportion of the flat part 2b to 41% or more.

In the LED element 1 having such a configuration, it is possible to decrease the thickness of the semiconductor lamination part 19 without deteriorating the crystal quality of the light-emitting layer 14 by setting the proportion of the flat part 2b to 41% or more. Moreover, it is possible to improve the crystal quality of the light-emitting layer 14 and to further improve the light extraction efficiency as long as the semiconductor lamination part 19 is as thick as the conventional semiconductor lamination part.

Moreover, it is possible to control the diameter at the base end of the projection part 2c by controlling the thickness of the metal mask. Further, it is possible to manufacture different projection parts 2c using the same mold 50 and to share the mold 50 to reduce the manufacturing cost.

Moreover, since the verticalizing moth-eye surface 2a is provided, therefore light being incident on the interface between the sapphire substrate 2 and the group III nitride semiconductor layer, by exceeding the critical angle of total reflection, can be directed toward the vertical with respect to the interface. In addition, as the transmission moth-eye surface 2g that suppresses the Fresnel reflection is provided, it is possible to smoothly extract light, whose angle is directed toward the vertical, to the outside of the element, at the interface between the sapphire substrate 2 and the outside of the element. Although the front surface and the back surface of the sapphire substrate 2 are both processed to have the projections and the depressions, both have different functions of the verticalizing function and the Fresnel reflection suppressing function, and the light extraction efficiency can be dramatically improved due to synergy between these functions.

Further, the distance of light, emitted from the light-emitting layer 14, until reaching the back surface of the sapphire substrate 2, can be reduced substantially, and the absorption of light in the element can be suppressed. The LED element has such a problem that light is absorbed in the element as light in the angle region exceeding the critical angle of the interface propagates laterally. However, light in the angle region exceeding the critical angle is directed toward the vertical at the verticalized moth-eye surface 2a, and the Fresnel reflection of the light that is directed toward the vertical is suppressed at the transmission moth-eye surface 2g, and thus the light absorbed in the element can be reduced drastically.

Moreover, light can be extracted using a large number of diffraction modes when the front surface of the sapphire substrate 2 has a plurality of projection parts 2c disposed at the intersections of virtual triangular lattices in a plan view thereof, and the triangles that form the virtual triangular lattice do not have a regular polygonal shape. In particular, the light extraction efficiency can be improved when the length of one side of triangles that form the virtual triangular lattice is twice or more than the optical wavelength of blue light and is 460 nm or smaller or between 550 nm and 800 nm. Moreover, when the triangles that form the virtual triangular lattice have an isosceles triangular shape, it is possible to increase the number of diffraction modes while regularly disposing the projection parts 2c. Further, light can be extracted using diffraction modes having different properties when the length of equilateral sides of an isosceles triangle is twice or more than the optical wavelength of blue light and is 400 nm or smaller and the length of the bottom side is between 550 nm and 800 nm.

Here, the present inventors have found out that, by using the combination of the dielectric multilayer films 22 and 25 and the metal layers 23 and 26 as the p-side electrode 27 and the n-side electrode 28, the light extraction efficiency of the LED element 1 increases substantially. Namely, when the dielectric multilayer films 22 and 25 and the metal layers 23 and 26 are combined, the reflectivity increases as the angle comes closer to the vertical with respect to the interface, which attains favorable reflection condition for light that is directed toward the vertical with respect to the interface.

Figure 16:
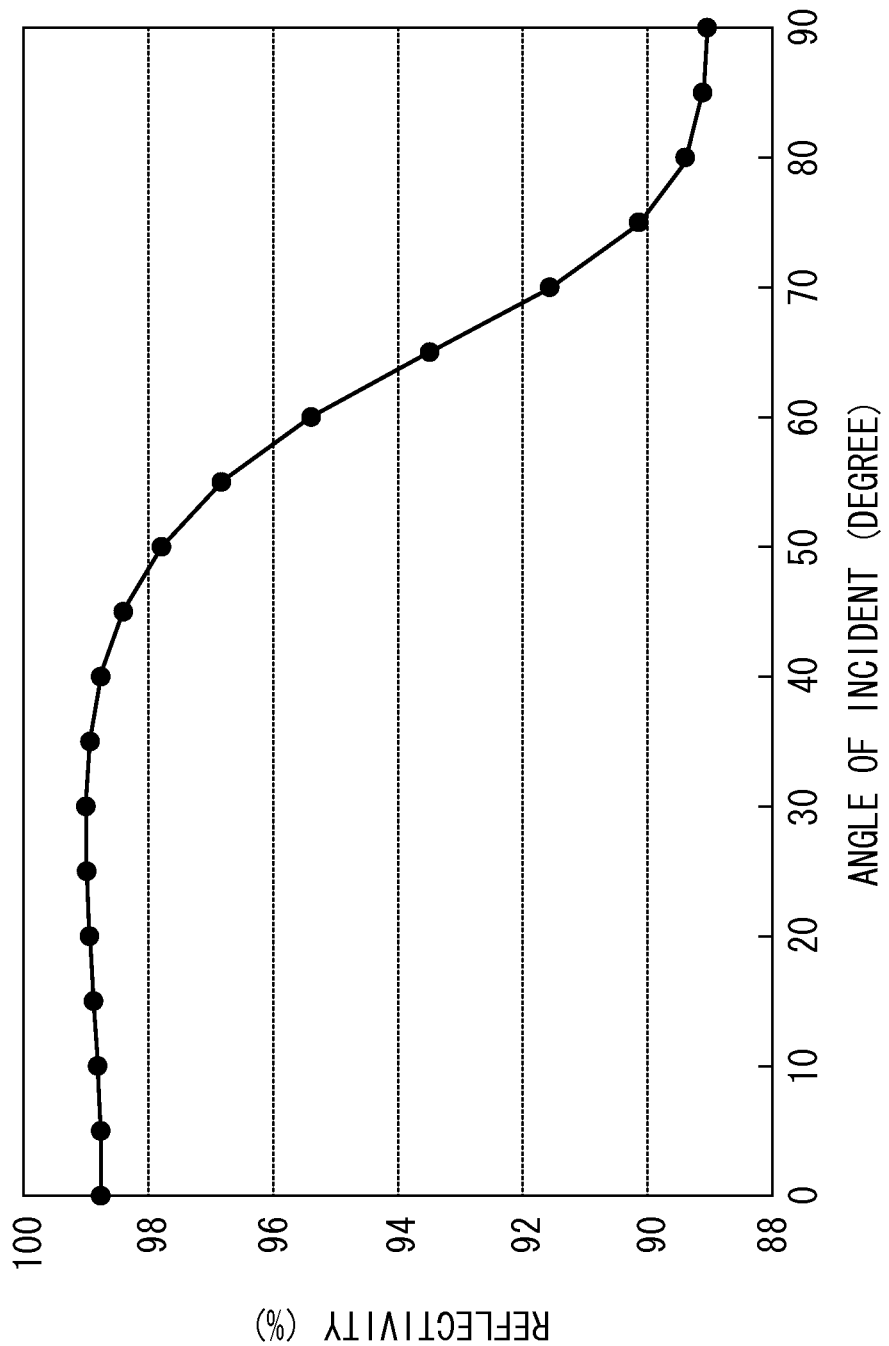
FIG. 16 is a graph illustrating reflectivity of a reflection part according to an example 1.

FIG. 16 is a graph illustrating the reflectivity of the reflection part according to an example 1. According to the example 1, five pairs of $ZrO_2$ and $SiO_2$ are combined to form the dielectric multilayer film on ITO, and the Al layer is formed to overlap the dielectric multilayer film. As illustrated in FIG. 16, the reflectivity of 98% or more is realized in the angle region where the angle of incident is from 0 degree to 45 degrees. Further, the reflectivity of 90% or more is realized in the angle region where the angle of incident is from 0 degree to 75 degrees. Thus, the combination of the dielectric multilayer film and the metal layer is favorable as the reflection condition for light that is directed toward the vertical with respect to the interface.

FIG. 17 is a graph illustrating the reflectivity of a reflection part according to an example 2. According to the example 2, only the Al layer is formed on ITO. As illustrated in FIG. 17, the reflectivity shows 84% almost constantly, irrespective of the angle of incident. Thus, the reflection part may be a single layer of metal, such as the Al layer.

Figure 18:
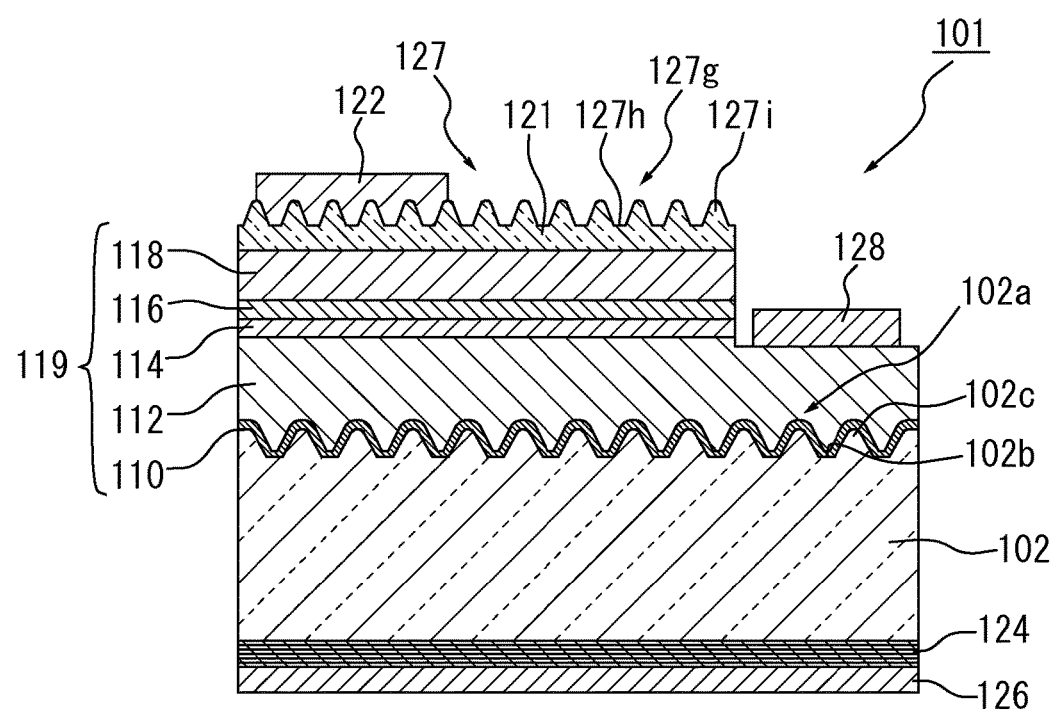
FIG. 18 is a schematic sectional view of an LED element according to a second embodiment of the present invention.

FIG. 18 is a schematic sectional view of an LED element according to a second embodiment of the present invention.

In this LED element 101, as illustrated in FIG. 18, a semiconductor lamination part 119 formed by a group III nitride semiconductor layer is formed on the front surface of a sapphire substrate 102. This LED element 101 is a face-up type, and light is mainly extracted from the side opposite to the sapphire substrate 102. The semiconductor lamination part 119 has a buffer layer 110, an n-type GaN layer 112, a light-emitting layer 114, an electron blocking layer 116, and a p-type GaN layer 118 in this order from the sapphire substrate 102 side. A p-side electrode 127 is formed on the p-type GaN layer 118, and an n-side electrode 128 is formed on the n-type GaN layer 112.

As illustrated in FIG. 18, the buffer layer 110 is formed on the front surface of the sapphire substrate 102, and is formed by MN. The n-type GaN layer 112 is formed on the buffer layer 110, and is formed by n-GaN. The light-emitting layer 114 is formed on the n-type GaN layer 112, and is formed by GaInN/GaN. According to this embodiment, a peak wavelength of light emitted from the light-emitting layer 114 is 450 nm.

The electron blocking layer 116 is formed on the light-emitting layer 114, and is formed by p-AlGaN. The p-type GaN layer 118 is formed on the electron blocking layer 116, and is formed by p-GaN. The n-type GaN layer 112 to the p-type GaN layer 118 are formed by epitaxial growth of the group III nitride semiconductor, and projection parts 102c are periodically formed on the front surface of the sapphire substrate 102. However, at the beginning of growth of the group III nitride semiconductor, planarization by lateral growth is made. Incidentally, the semiconductor layer may be constituted freely as long as it includes at least a first conductivity type layer, an active layer, and a second conductivity type layer, and it emits light from the active layer by recombination of an electron and a hole when a voltage is applied to the first conductivity type layer and the second conductivity type layer.

In the present embodiment, the front surface of the sapphire substrate 102 forms a verticalizing moth-eye surface 102a, and the p-side electrode 127 forms a transmissive moth-eye surface 127g. A flat part 102b and the plurality of projections 102c that are periodically formed on the flat part 102b are formed on the front surface of the sapphire substrate 102. Moreover, the sapphire substrate 102 is configured such that the proportion of the flat part 102b is 40% or more in a plan view thereof. Examples of the shape of each projection 102c include a pyramidal shape such as a conical shape or a polygonal pyramidal shape and a truncated pyramidal shape obtained by cutting the top of a pyramid such as a truncated conical shape or a truncated polygonal pyramidal shape. Each projection 102c is designed to diffract light emitted from the light-emitting layer 114. In the present embodiment, the light verticalizing effect can be obtained by the projections 102c disposed periodically.

The p-side electrode 127 includes a diffusion electrode 121 that is formed on the p-type GaN layer 118, and a pad electrode 122 that is formed on a part of the diffusion electrode 121. The diffusion electrode 121 is formed entirely on the p-type GaN layer 118, and is formed by a transparent material such as ITO (Indium Tin Oxide), for example. The pad electrode 122 is formed by a metal material such as Al, for example. On the front surface of the diffusion electrode 121, a flat part 127h and a plurality of projection parts 127i that are periodically formed on the flat part 127h are formed. The shape of each projection part 127i may be a pyramid shape such as a cone, a polygonal pyramid or the like, or may be a truncated pyramid shape, as a pyramid whose upper portion is cut off, such as a truncated cone, a truncated polygonal pyramid or the like. A period of the projection parts 127i on the transmission moth-eye surface is less than twice an optical wavelength of the light-emitting layer 114. According to this embodiment, the respective projection parts 127i arranged periodically suppress the Fresnel reflection at the interface with the outside.

The n-side electrode 128 is formed on the n-type GaN layer 112 exposed after etching the p-type GaN layer 118 to the n-type GaN layer 112. The n-side electrode 128 is formed on the n-type GaN layer 112, and is formed by a metal material such as Al, for example.

Figure 19:
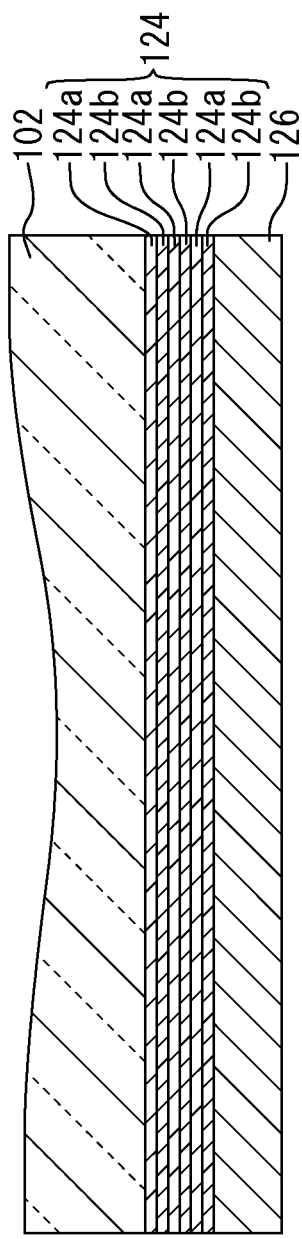
FIG. 19 is a partially enlarged schematic sectional view of the LED element.

FIG. 19 is a partially enlarged schematic sectional view of the LED element.

As illustrated in FIG. 19, a dielectric multilayer film 124 is formed on the back surface of the sapphire substrate 102. The dielectric multilayer film 124 is formed by repeatedly stacking a plurality of pairs of a first material 124a and a second material 124b, having different indices of refraction. The dielectric multilayer film 124 is covered by an Al layer 126 which is a metal layer. In this light-emitting element 101, the dielectric multilayer film 124 and the Al layer 126 form a reflecting portion, and light emitted from the light-emitting layer 114 and transmitted through the verticalizing moth-eye surface 102a by the diffraction effect is reflected from the reflecting portion. The light transmitted by the diffraction effect is incident on the diffractive surface 102a again and is transmitted through the diffractive surface 102a again by the diffraction effect, whereby the light can be extracted outside the element in a plurality of modes.

In the LED element 101 having such a configuration, it is possible to decrease the thickness of the semiconductor lamination part 119 without deteriorating the crystal quality of the light-emitting layer 114 by setting the proportion of the flat part 102b to 41% or more. Moreover, it is possible to improve the crystal quality of the light-emitting layer 114 and to further improve the light extraction efficiency as long as the semiconductor lamination part 119 is as thick as the conventional semiconductor lamination part.

Moreover, since the verticalizing moth-eye surface 102a is provided, light incident on the interface between the sapphire substrate 102 and the group-III nitride semiconductor layer at an angle exceeding the critical angle for total reflection can be directed closer to the vertical direction.

Moreover, since the transmissive moth-eye surface 127g is provided, it is possible to suppress the Fresnel reflection of light which is directed toward the vertical direction at the interface between the sapphire substrate 102 and the outside of the element. In this way, the light extraction efficiency can be dramatically improved.

Further, the distance of light, emitted from the light-emitting layer 114, until reaching the front surface of the p-side electrode 127, can be reduced substantially, and the absorption of light in the element can be suppressed. The LED element has such a problem that light is absorbed in the element as light in the angle region exceeding the critical angle of the interface propagates laterally. However, light in the angle region exceeding the critical angle is directed toward the vertical at the verticalized moth-eye surface 102a, and thus the light absorbed in the element can be reduced drastically.

Moreover, light can be extracted using a large number of diffraction modes when the front surface of the sapphire substrate 102 has a plurality of projections 102c disposed at the intersections of virtual triangular lattices in a plan view thereof, and the triangles that form the virtual triangular lattice do not have a regular polygonal shape. In particular, the light extraction efficiency can be improved when the length of one side of triangles that form the virtual triangular lattice is twice or more than the optical wavelength of blue light and is 460 nm or smaller or between 550 nm and 800 nm. Moreover, when the triangles that form the virtual triangular lattice have an isosceles triangular shape, it is possible to increase the number of diffraction modes while regularly disposing the projections 102c. Further, light can be extracted using diffraction modes having different properties when the length of equilateral sides of an isosceles triangle is twice or more than the optical wavelength of blue light and is 400 nm or smaller and the length of the bottom side is between 550 nm and 800 nm.

Here, the present inventors have found out that, by using the combination of the dielectric multilayer film 124 and the metal layer 126 as the reflection part at the back surface of the sapphire substrate 102, the light extraction efficiency of the LED element 101 increases substantially. Namely, when the dielectric multilayer film 124 and the metal layer 126 are combined, the reflectivity increases as the angle comes closer to the vertical with respect to the interface, which attains favorable reflection condition for the light directed toward the vertical with respect to the interface.

Figure 20:
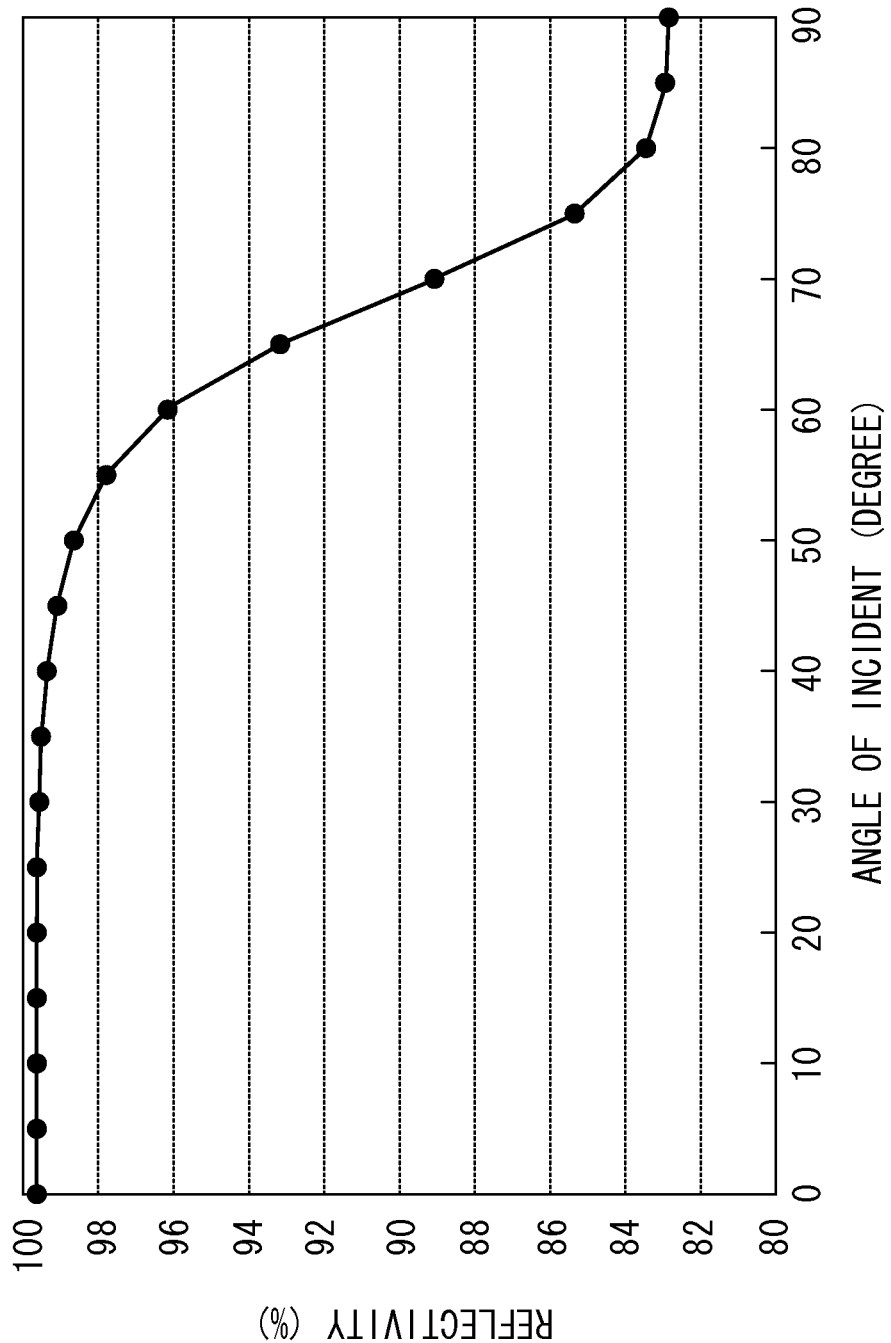
FIG. 20 is a graph illustrating the reflectivity of a reflection part according to an example 3.

FIG. 20 is a graph illustrating the reflectivity of a reflection part according to an example 3. According to the example 3, five pairs of $ZrO_2$ and $SiO_2$ are combined to form the dielectric multilayer film formed on the sapphire substrate, and the Al layer is formed to overlap the dielectric multilayer film. As illustrated in FIG. 20, the reflectivity of 99% or more is realized in the angle region where the angle of incident is from 0 degree to 55 degrees. Furthermore, the reflectivity of 98% or more is realized in the angle region where the angle of incident is from 0 degree to 60 degrees. Furthermore, the reflectivity of 92% or more is realized in the angle region where the angle of incident is from 0 degree to 75 degrees. Thus, the combination of the dielectric multilayer film and the metal layer attains the favorable reflection condition for the light directed toward the vertical with respect to the interface.

Figure 21:
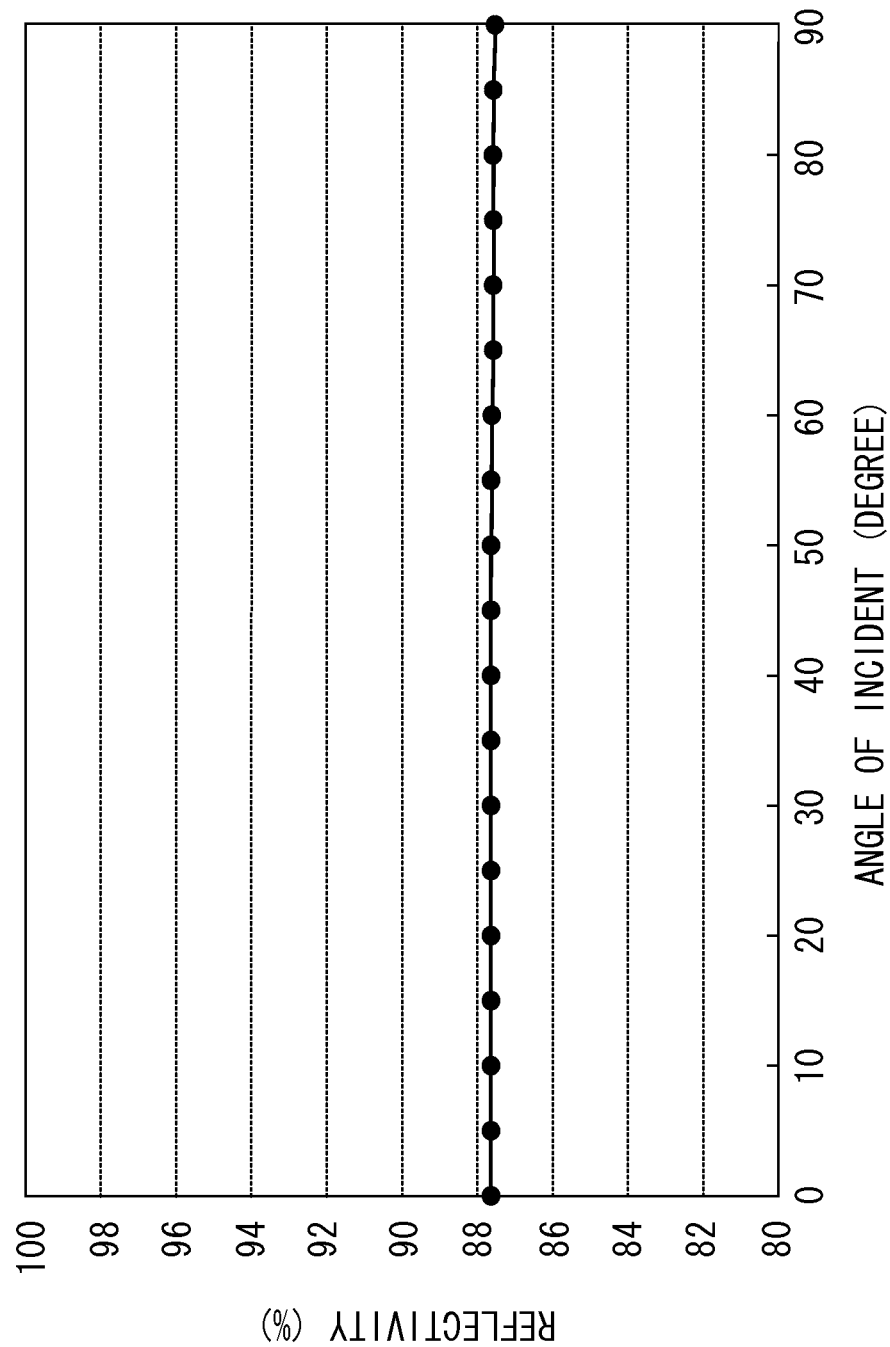
FIG. 21 is a graph illustrating the reflectivity of a reflection part according to an example 4.

FIG. 21 is a graph illustrating the reflectivity of a reflection part according to an example 4. According to the example 4, only the Al layer is formed on the sapphire substrate. As illustrated in FIG. 21, the reflectivity shows 88% almost constantly, irrespective of the angle of incident. Thus, the reflection part may be a single layer of metal, such as the Al layer.

Figure 22:
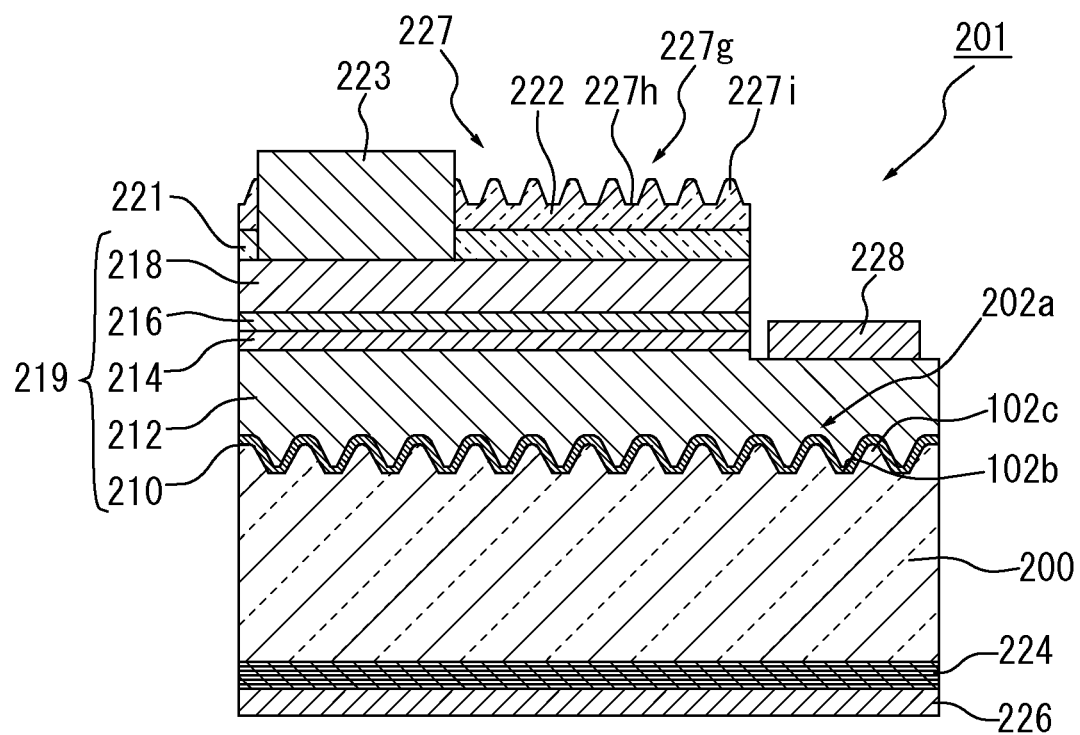
FIG. 22 is a schematic sectional view of an LED element according to a second embodiment of the present invention.

FIG. 22 is a schematic sectional view of an LED element according to a third embodiment of the present invention.

As illustrated in FIG. 22, an LED element 201 is a face-up type LED element in which a semiconductor lamination part 219 formed of a group-III nitride semiconductor layer is formed on a front surface of a sapphire substrate 202. The semiconductor lamination part 219 has a buffer layer 210, an n-type GaN layer 212, a light-emitting layer 214, an electron blocking layer 216, and a p-type GaN layer 218 in that order from the side of the sapphire substrate 202. A p-side electrode 227 is formed on the p-type GaN layer 218, and an n-side electrode 228 is formed on the n-type GaN layer 212.

As illustrated in FIG. 22, the buffer layer 210 is formed on the front surface of the sapphire substrate 2 and is formed of MN. In the present embodiment, the buffer layer 210 is formed by an MOCVD (Metal Organic Chemical Vapor Deposition) method, but may be formed by a sputtering method. The n-type GaN layer 212 as a first conductivity-type layer is formed on the buffer layer 210 and is formed of n-GaN. The light-emitting layer 214 is formed on the n-type GaN layer 212 and is formed of GaInN/GaN and emits blue light by electron and hole injection. Here, the blue light means light whose peak wavelength is between 430 nm and 480 nm, for example. In the present embodiment, a peak wavelength of the light emitted from the light-emitting layer 214 is 450 nm.

The electron blocking layer 216 is formed on the light-emitting layer 214 and is formed of p-AlGaN. The p-type GaN layer 218 as a second conductivity-type layer is formed on the electron blocking layer 216 and is formed of p-GaN. The layers ranging from the n-type GaN layer 212 to the p-type GaN layer 218 are formed by epitaxial growth of the group-III nitride semiconductor. Although projection parts 2c are periodically formed on the front surface of the sapphire substrate 2, planarization is realized by lateral growth in the initial stage of the growth of the group-III nitride semiconductor. Moreover, the layer configuration of the semiconductor layer is optional as long as the semiconductor layer includes at least a first conductivity-type layer, an active layer, and a second conductivity-type layer, and the active layer emits light by electron-hole recombination when a voltage is applied to the first conductivity-type layer and the second conductivity-type layer.

The front surface of the sapphire substrate 202 forms a verticalizing moth-eye surface 202a, and the front surface of the p-side electrode 227 forms a transmissive moth-eye surface 227g. A flat part 202b and a plurality of projection parts 202c that are periodically formed on the flat part 202b are formed on the front surface of the sapphire substrate 202. Moreover, the sapphire substrate 202 is configured so that the proportion of the flat parts 202b is 40% or more in a plan view thereof. Examples of the shape of each projection part 202c include a pyramidal shape such as a conical shape or a polygonal pyramidal shape and a truncated pyramidal shape obtained by cutting the top of a pyramid such as a truncated conical shape or a truncated polygonal pyramidal shape. Each projection part 202c is designed to diffract light emitted from the light-emitting layer 214. In the present embodiment, the light verticalizing effect can be obtained by the projection parts 202c disposed periodically. Here, the light verticalizing effect means an effect by which light intensity distribution after the light is reflected from and transmitted through the verticalizing moth-eye surface is inclined closer to the direction vertical to the interface between the sapphire substrate 202 and the semiconductor lamination part 219 than before the light is incident on the verticalizing moth-eye surface.

A dielectric multilayer film 224 is formed on the back surface of the sapphire substrate 202. The dielectric multilayer film 224 is covered by an Al layer 226 which is a metal layer. In this light-emitting element 201, the dielectric multilayer film 224 and the Al layer 226 form a reflecting portion, and light emitted from the light-emitting layer 214 and transmitted through the verticalizing moth-eye surface 202a by the diffraction effect is reflected from the reflecting portion. The light transmitted by the diffraction effect is incident on the diffractive surface 202a again and is transmitted through the diffractive surface 202a again by the diffraction effect, whereby the light can be extracted outside the element in a plurality of modes.

The p-side electrode 227 includes a diffusion electrode layer 221 formed on the p-type GaN layer 218 and a moth-eye layer 222 formed on the diffusion electrode layer 221. Moreover, in the present embodiment, the p-side electrode 227 includes a pad electrode 223 that passes through the diffusion electrode layer 221 and the moth-eye layer 222 so as to make contact with the p-type GaN layer 218. The diffusion electrode layer 221 is formed on the p-type GaN layer 218 excluding a formation region of the pad electrode 223 and is formed of a transparent material. Moreover, the moth-eye layer 222 is formed on the diffusion electrode layer 221 excluding the formation region of the pad electrode 223 and is formed of a transparent material. The moth-eye layer 222 is formed of a material that has a smaller extinction coefficient than a material that forms the diffusion electrode layer 221 and has approximately the same index of refraction as the material that forms the diffusion electrode layer 221. Approximately the same index of refraction means that a difference between the indices of refraction of the diffusion electrode layer 221 and the moth-eye layer 222 is within 20% of the index of refraction of the moth-eye layer 222. Moreover, the diffusion electrode layer 221 is formed of a material that has a smaller sheet resistance than the moth-eye layer 222 and is formed thinner than the moth-eye layer 222. Further, the thickness of the diffusion electrode layer 221 is smaller than the thickness of the moth-eye layer 222. Moreover, the pad electrode 223 is formed of a metal material such as Al, for example. Moreover, the pad electrode 223 is formed of a material that exhibits stronger adhesion to the semiconductor lamination part 219 than adhesion to the diffusion electrode layer 221.

In the present embodiment, the diffusion electrode layer 221 is formed of ITO (Indium Tin Oxide) having a thickness of 100 nm and the moth-eye layer 222 is formed of $ZrO_2$ having a thickness of 400 nm. For light having a wavelength of 450 nm, the extinction coefficient of ITO is 0.04 and the extinction coefficient of $ZrO_2$ is approximately 0. Moreover, for light having a wavelength of 450 nm, the index of refraction of ITO is 2.04 and the index of refraction of $ZrO_2$ is 2.24. The diffusion electrode layer 221 may be formed of a material such as IZO (Indium Zinc Oxide), for example, and the moth-eye layer 222 may be formed of a material such as $Nb_2O_5$, for example.

A flat part 227h and a plurality of projection parts 227i that are periodically formed on the flat part 227h are formed on the front surface of the moth-eye layer 222. Examples of the shape of each projection part 227i include a pyramidal shape such as a conical shape or a polygonal pyramidal shape and a truncated pyramidal shape obtained by cutting the top of a pyramid such as a truncated conical shape or a truncated polygonal pyramidal shape. The period of the projection parts 227i on the transmissive moth-eye surface is smaller than twice the optical wavelength of the light-emitting layer 214. In the present embodiment, the respective projection parts 227i disposed periodically suppress Fresnel reflection at the interface with the outside.

The n-side electrode 228 is formed on the n-type GaN layer 212 exposed after etching the p-type GaN layer 218 to form the n-type GaN layer 212. The n-side electrode 228 is formed on the n-side GaN layer 212 and is formed of a metal material such as Al, for example.

Figure 23:
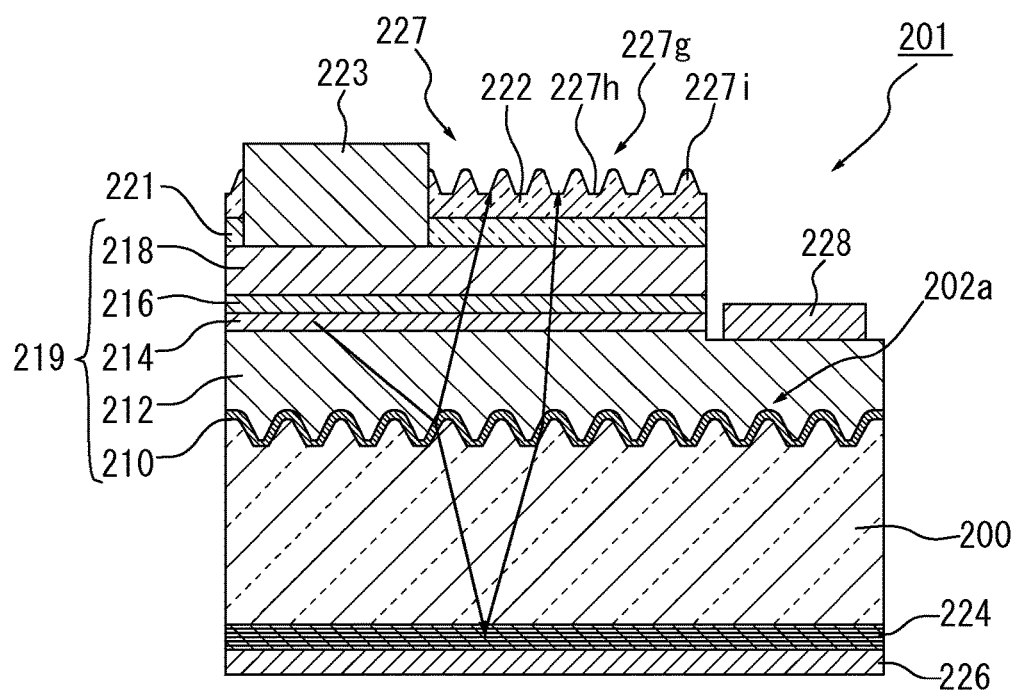
FIG. 23 is an explanatory view illustrating the traveling direction of light inside the element.

FIG. 23 is an explanatory view illustrating the traveling direction of light in the element.

As illustrated in FIG. 23, light incident on the sapphire substrate 202 at an angle exceeding the critical angle, among the light components emitted from the light-emitting layer 214, is transmitted through and reflected from the verticalizing moth-eye surface 202a toward the vertical direction, as compared to the direction when it is incident on the verticalizing moth-eye surface 202a. That is, light that is reflected the verticalizing moth-eye surface 202a is incident on the transmissive moth-eye surface 227g by changing its angle so as to be directed closer to the vertical direction. Further, light that passes through the verticalizing moth-eye surface 202a, whose angle is changed so as to be directed toward the vertical, is reflected from a reflecting portion that is made up of the dielectric multilayer film 224 and the Al layer 226, and thereafter, is incident on the verticalizing moth-eye surface 202a again. The angle of incidence at this time is closer to the vertical than the previous angle of incident. As a result, light incident on the transmissive moth-eye surface 227g can be directed toward the vertical.

Moreover, the transmissive moth-eye surfaces 227g of the p-side electrode 227 are formed so as to be aligned at the intersections of virtual triangular lattices with a predetermined period so that the centers of the respective projection parts 227i are positioned at the vertices of regular triangles in a plan view thereof. The shortest period of the projection parts 227i is smaller than the optical wavelength of the light emitted from the light-emitting layer 214. That is, the Fresnel reflection is suppressed in the transmissive moth-eye surface 227g. In the present embodiment, the length of one side of the regular triangles that form the virtual triangular lattice is 300 nm. That is, the shortest period of the projection parts 227i is 300 nm. Since the wavelength of the light emitted from the light-emitting layer 214 is 450 nm and the index of refraction of $ZrO_2$ is 2.24, the optical wavelength thereof is 200.9 nm. That is, the shortest period of the transmissive moth-eye surfaces 227g is smaller than twice the optical wavelength of the light-emitting layer 214. When the period of the moth-eye surfaces is equal to or smaller than twice the optical wavelength, the Fresnel reflection at the interface can be suppressed. It is possible to sufficiently obtain the effect of suppressing the Fresnel reflection when the shortest period of the projection parts 227i is smaller than twice the optical wavelength. Moreover, it is possible to obtain a larger effect of suppressing the Fresnel reflection when all periods of the projection parts 227i are smaller than twice the optical wavelength. The effect of suppressing the Fresnel reflection increases as the period of the transmissive moth-eye surface 227g approaches one times from two times the optical wavelength. When the outside of the moth-eye layer 222 is resin or air, and when the period of the transmissive moth-eye surfaces 227g is equal to or smaller than 1.25 times the optical wavelength, it is possible to obtain approximately the same effect of suppressing the Fresnel reflection as when the period is one times or smaller than the optical wavelength.

Figure 24:
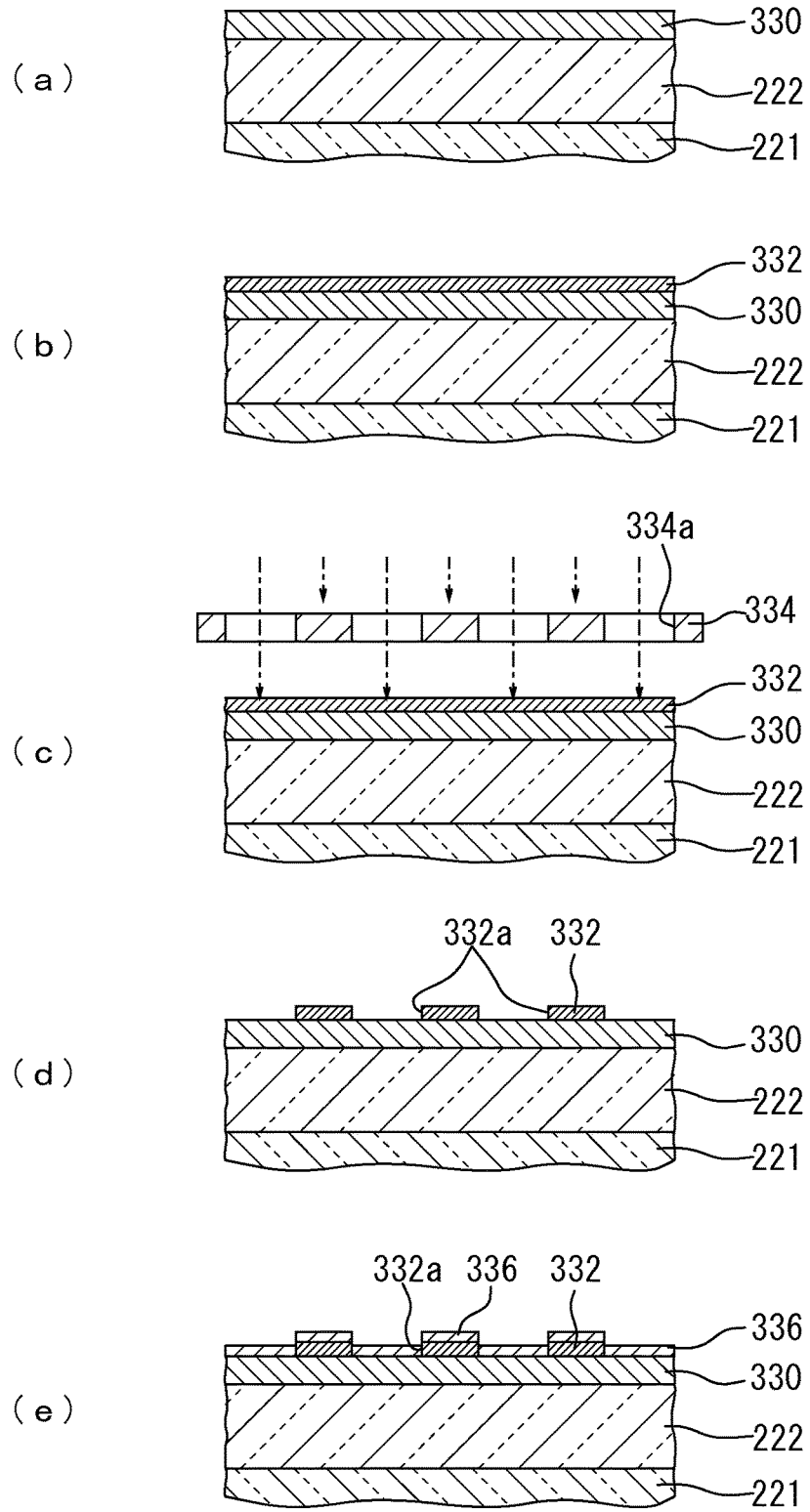
FIG. 24 is an explanatory view for describing the processes of processing a moth-eye layer, in which (a) illustrates a state where a first mask layer is formed on a transmissive moth-eye surface, (b) illustrates a state where a resist layer is formed on the first mask layer, (c) illustrates a state where the resist layer is selectively irradiated with an electron beam, (d) illustrates a state where the resist layer is developed and removed, and (e) illustrates a state where a second mask layer is formed.

Next, a method of forming the transmissive moth-eye surface 227g of the p-side electrode 227 will be described with reference to FIG. 24 and FIG. 25. FIG. 24 is an explanatory view for describing the processes of processing a moth-eye layer, in which (a) illustrates a state where a first mask layer is formed on a transmissive moth-eye surface, (b) illustrates a state where a resist layer is formed on the first mask layer, (c) illustrates a state where the resist layer is selectively irradiated with an electron beam, (d) illustrates a state where the resist layer is developed and removed, and (e) illustrates a state where a second mask layer is formed.

First, as illustrated in FIG. 24(a), a first mask layer 330 is formed on the front surface of the moth-eye layer 222. The first mask layer 330 is formed of $SiO_2$, for example, and is formed by a sputtering method, a vacuum deposition method, a CVD method, or the like. Although the thickness of the first mask layer 330 is optional, the thickness is 1.0 μm, for example.

Next, as illustrated in FIG. 24(b), a resist layer 332 is formed on the first mask layer 330 of the moth-eye layer 222. The resist layer 332 is formed of an electron beam-sensitive material such as ZEP (product of ZEON Corporation) and is applied to the first mask layer 330. Although the thickness of the resist layer 332 is optional, the thickness is between 100 nm and 2.0 μm, for example.

Next, as illustrated in FIG. 24(c), a stencil mask 334 is set so as to be separated from the resist layer 332. The gap between the resist layer 332 and the stencil mask 334 is between 1.0 μm and 100 μm. The stencil mask 334 is formed of a material such as diamond or SiC, for example, and may have an optional thickness (for example, between 500 nm and 100 μm). The stencil mask 334 has openings 334a through which electron beams pass selectively.

After that, as illustrated in FIG. 24(c), the stencil mask 334 is irradiated with electron beams so that the resist layer 332 is exposed to the electron beams having passed through the openings 334a of the stencil mask 334. Specifically, the pattern of the stencil mask 334 is transferred to the resist layer 332 using an electron beam dose of 10 to 100 $\mu C/cm^2$, for example.

After irradiation of electron beams is completed, the resist layer 332 is developed using a predetermined developing solution. As a result, as illustrated in FIG. 24(d), the portions irradiated with electron beams are eluted to the developing solution, and the portions which are not irradiated with electron beams remain, whereby openings 332a are formed. When ZEP (product of ZEON Corporation) is used as the resist layer 332, amyl acetate, for example, can be used as the developing solution.

Next, as illustrated in FIG. 24(e), a second mask layer 336 is formed on the first mask layer 330 on which the resist layer 332 is patterned. In this way, the second mask layer 336 is patterned on the first mask layer 330 using irradiation of electron beams. The second mask layer 336 is formed of Ni, for example, and is formed by a sputtering method, a vacuum deposition method, a CVD method, or the like. Although the thickness of the second mask layer 336 is optional, the thickness is 20 nm, for example.

Figure 25:
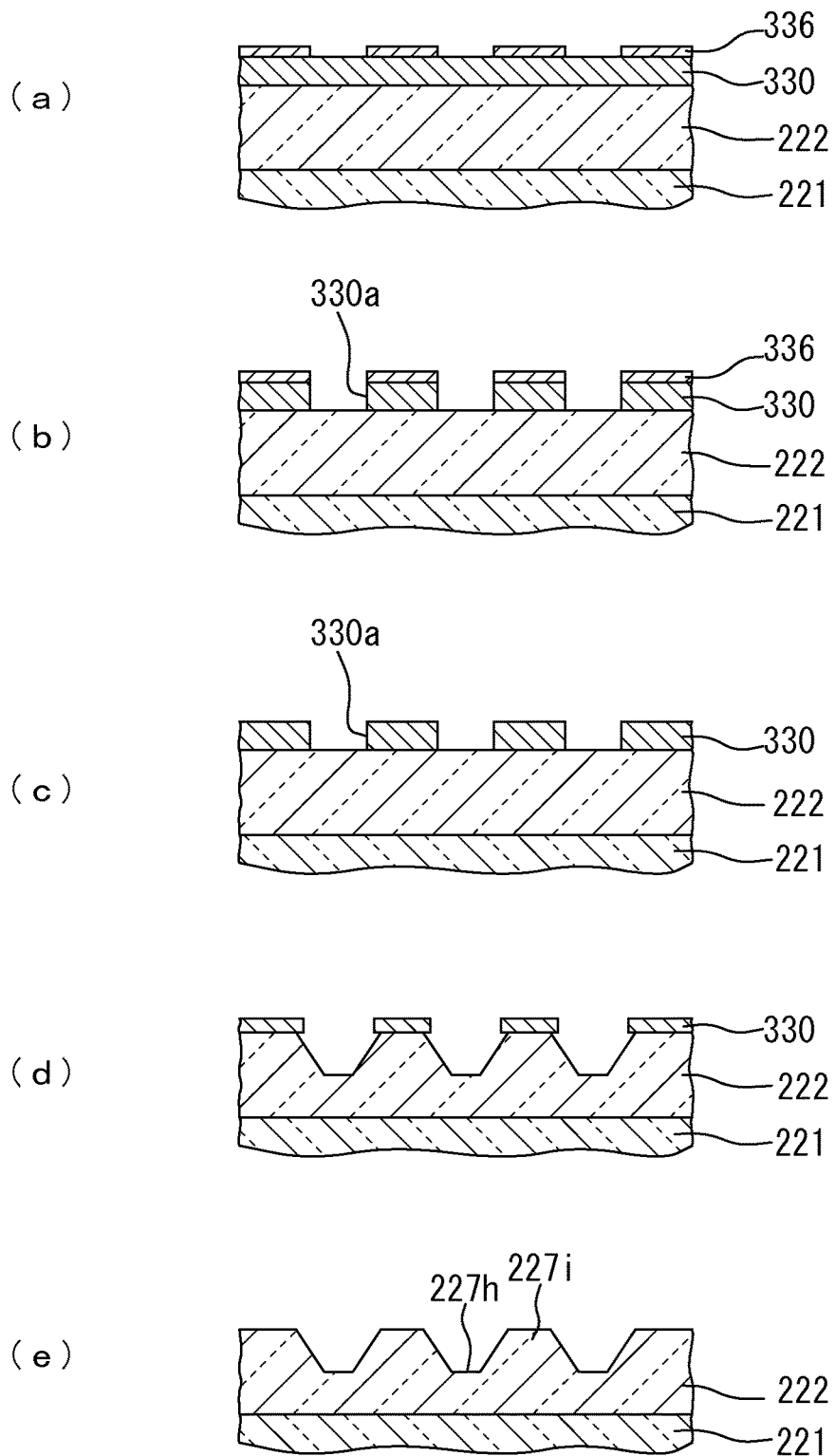
FIG. 25 is an explanatory view for describing the processes of processing the moth-eye layer, in which (a) illustrates a state where the resist layer is completely removed, (b) illustrates a state where the first mask layer is etched using the second mask layer as a mask, (c) illustrates a state where the second mask layer is removed, (d) illustrates a state where the transmissive moth-eye surface is etched using the first mask layer as a mask, and (e) illustrates a state where the first mask layer is removed.

FIG. 25 is an explanatory view for describing the processes of processing the moth-eye layer, in which (a) illustrates a state where the resist layer is completely removed, (b) illustrates a state where the first mask layer is etched using the second mask layer as a mask, (c) illustrates a state where the second mask layer is removed, (d) illustrates a state where the transmissive moth-eye surface is etched using the first mask layer as a mask, and (e) illustrates a state where the first mask layer is removed.

As illustrated in FIG. 25(a), the resist layer 332 is removed using a removal solution. For example, the resist layer 332 can be removed by immersing the same in the removal solution and irradiating the same with ultrasound waves for a predetermined period. Specifically, diethyl ketone, for example, can be used as the removal solution. In this way, the pattern of the second mask layer 336 obtained by inverting the pattern of the openings 334a of the stencil mask 334 is formed on the first mask layer 330.

Next, as illustrated in FIG. 25(b), the first mask layer 330 is subjected to dry-etching using the second mask layer 336 as a mask. In this way, openings 330a are formed in the first mask layer 330 and the pattern of the first mask layer 330 is formed. In this case, an etching gas is used such that the moth-eye layer 222 and the first mask layer 330 have higher durability than the second mask layer 336. For example, when the first mask layer 330 is $SiO_2$, the second mask layer 336 is Ni, and a fluorine-based gas such as $SF_6$ is used, since Ni has an etching selectivity of approximately 100 in relation to $SiO_2$, the first mask layer 330 can be patterned accurately.

After that, as illustrated in FIG. 25(c), the second mask layer 336 on the first mask layer 330 is removed. When the first mask layer 330 is $SiO_2$ and the second mask layer 336 is Ni, Ni can be removed by immersing the same in a solution of hydrochloric acid and nitric acid mixed at the ratio of approximately 1:1 and diluted with water or subjecting the same to dry-etching using an argon gas.

Subsequently, as illustrated in FIG. 25(d), the moth-eye layer 222 is subjected to dry-etching using the first mask layer 330 as a mask. In this case, since the portions of the moth-eye layer 222 in which the first mask layer 330 is removed are exposed to an etching gas, the inverted pattern of the openings 334a of the stencil mask 334 can be transferred to the moth-eye layer 222. In this case, since the first mask layer 330 has higher durability to the etching gas than the moth-eye layer 222, the portions which are not covered by the first mask layer 330 can be selectively etched. The etching ends when the etching depth of the moth-eye layer 222 reaches a predetermined depth. Here, a chlorine-based gas such as $Cl_2$ and fluorine-containing gas, for example, can be used as the etching gas. Since the fluorine-based gas cannot etch ITO, when ITO is used as the diffusion electrode layer 221, the diffusion electrode layer 221 will not be processed exceeding the moth-eye layer 222. That is, even when the moth-eye layer 222 has a minimum thickness necessary for forming the projection-and-depression structure and the diffusion electrode layer 221 is exposed during etching, the diffusion electrode layer 221 will not be etched.

After that, as illustrated in FIG. 25(e), the first mask layer 330 remaining on the moth-eye layer 222 is removed using a predetermined removal solution. When $SiO_2$ is used as the first mask layer 330, rare hydrofluoric acid, for example, can be used as the removal solution. In this case, if the mask formed of $SiO_2$ is also formed in the formation region of the pad electrode 223 of the p-type GaN layer 218, the mask can be removed together. After that, the pad electrode 223 is formed on the moth-eye layer 222. In this way, after the projection parts 227i are formed on the front surface of the p-side electrode 227, the sapphire substrate is diced and divided into a plurality of LED elements 201, whereby the LED element 201 is manufactured.

In the LED element 201 having such a configuration, the current flowing from the semiconductor lamination part 219 toward the p-side electrode 227 is diffused in the diffusion electrode layer 221 and flows into the pad electrode 223. In this case, since the diffusion electrode layer 221 has a low sheet resistance, the current can be diffused accurately. Since the pad electrode 223 and the diffusion electrode layer 221 are in direct contact with each other, current flows directly from the diffusion electrode layer 221 to the pad electrode 223 without via the moth-eye layer 222. Here, since the pad electrode 223 is formed of a material that exhibits stronger adhesion to the semiconductor lamination part 219 than adhesion to the diffusion electrode layer 221, the pad electrode 223 is not easily separated from the semiconductor lamination part 219 due to mechanical load or the like.

On the other hand, the light incident on the p-side electrode 227 is extracted outside after passing through the diffusion electrode layer 221 and the moth-eye layer 2220. Here, since the diffusion electrode layer 221 having a high extinction coefficient is thin and the moth-eye layer 222 having a low extinction coefficient is thick, it is possible to decrease the amount of light absorbed in the p-side electrode 227. As a result, it is possible to improve the light extraction efficiency of the LED element 201. Moreover, since the diffusion electrode layer 221 and the moth-eye layer 222 have approximately the same index of refraction, it is possible to suppress total reflections at the interface between the two layers.

Moreover, since the verticalizing moth-eye surface 202a is provided, light incident on the interface between the sapphire substrate 202 and the group-III nitride semiconductor layer at an angle exceeding the critical angle for total reflection can be directed closer to the direction vertical to the interface. Moreover, since the transmissive moth-eye surface 227g that suppresses the Fresnel reflection is provided, light which is directed closer to the vertical direction can be extracted outside of the element at the interface between the sapphire substrate 202 and the outside of the element. As a result, the light extraction efficiency can be dramatically improved.

Further, the distance travelled by the light emitted from the light-emitting layer 214 until reaching the transmissive moth-eye surface 227g can be reduced remarkably, and the absorption of light in the element can be suppressed. LED elements have such a problem that light is absorbed in the element since light in the angle region exceeding the critical angle of the interface propagates in a lateral direction. However, since light in the angle region exceeding the critical angle is directed toward the vertical direction in the verticalizing moth-eye surface 202a, and the Fresnel reflection of the light being directed toward the vertical direction is suppressed in the transmissive moth-eye surface 227g, the light absorbed in the element can be reduced dramatically.

Moreover, it is possible to decrease the thickness of the semiconductor lamination part 219 without deteriorating the crystal quality of the light-emitting layer 214 by setting the proportion of the flat part 202b to 41% or more. Moreover, it is possible to improve the crystal quality of the light-emitting layer 214 and to further improve the light extraction efficiency as long as the semiconductor lamination part 219 is as thick as the conventional semiconductor lamination part.

Moreover, light can be extracted using a large number of diffraction modes when the front surface of the sapphire substrate 202 has a plurality of projection parts 202c disposed at the intersections of virtual triangular lattices in a plan view thereof, and the triangles that form the virtual triangular lattice do not have a regular polygonal shape. In particular, the light extraction efficiency can be improved when the length of one side of triangles that form the virtual triangular lattice is twice or more than the optical wavelength of blue light and is 460 nm or smaller or between 550 nm and 800 nm. Moreover, when the triangles that form the virtual triangular lattice have an isosceles triangular shape, it is possible to increase the number of diffraction modes while regularly disposing the projection parts 102c. Further, light can be extracted using diffraction modes having different properties when the length of equilateral sides of an isosceles triangle is twice or more than the optical wavelength of blue light and is 460 nm or smaller and the length of the bottom side is between 550 nm and 800 nm.

Here, the present inventors have found that the light extraction efficiency of the LED element 201 increased remarkably when the combination of the dielectric multilayer film 224 and the metal layer 226 was used as the reflecting portion on the back surface of the sapphire substrate 202. That is, when the combination of the dielectric multilayer film 224 and the metal layer 226 is used, the reflectivity increases as the angle comes closer to the vertical with respect to the interface, which attains a favorable reflection condition for the light that is directed toward the vertical with respect to the interface.

According to the above-described embodiments, although a configuration in which the verticalizing moth-eye surface and the transmissive moth-eye surface are formed by the projection parts formed periodically has been illustrated, the moth-eye surfaces can naturally be configured by the depression parts formed periodically. Moreover, although a configuration in which the transmissive moth-eye surface is formed in the p-side electrode has been illustrated, the transmissive moth-eye surface may be further formed in the n-side electrode. Moreover, the projection parts or the depression parts may be formed so as to be aligned at the intersections of virtual square lattices, for example, instead of forming the same at the intersections of the triangular lattices.

While the embodiments of the present invention has been described, the embodiments described above do not limit the inventions disclosed in the claims. It should also be noted that all combinations of the features explained in the embodiments are not necessarily essential to the means for solving the problem in the invention.

INDUSTRIAL APPLICABILITY

The LED light-emitting element and the method of manufacturing the same according to the present invention are industrially useful because the element and the method can further improve the light extraction efficiency.

REFERENCE SIGNS LIST

1 LED element
2 Sapphire substrate
2a Verticalizing moth-eye surface
2b Flat part
2c Projection part
2d Side surface
2e Bent portion
2f Top surface
2g Transmission moth-eye surface
2h Flat part
2i Projection part
10 Buffer layer
12 N-type GaN layer
14 Light-emitting layer
16 Electron blocking layer
18 P-type GaN layer
19 Semiconductor lamination part
21 Diffusion electrode
22 Dielectric multilayer film
22a First material
22b Second material
22c Via hole
23 Metal electrode
24 Diffusion electrode
25 Dielectric multilayer film
25a Via hole
26 Metal electrode
27 P-side electrode
28 N-side electrode
30 Mask layer
31 SiO$_2$ layer
32 Ni layer
40 Resist film
41 Projection-and-depression structure
42 Residual film
43 Projection part
50 Mold
51 Projection-and-depression structure
91 Plasma etching apparatus
92 Substrate holding table
93 Container
94 Coil
95 Power supply
96 Quartz plate
97 Cooling controller unit
98 Plasma
101 LED element
102 Sapphire substrate
102a Verticalizing moth-eye surface
110 Buffer layer
112 N-type GaN layer
114 Light-emitting layer
116 Electron blocking layer
118 P-type GaN layer
119 Semiconductor lamination part
122 Pad electrode
124 Dielectric multilayer film
124a First material
124b Second material
126 Al layer
127 P-side electrode
127g Transmission moth-eye surface
128 N-side electrode
201 LED element
202 Sapphire substrate
202a Verticalizing moth-eye surface
202b Flat part
202c Projection part
210 Buffer layer
212 N-side GaN layer
214 Light-emitting layer
216 Electron blocking layer
218 P-type GaN layer
219 Semiconductor lamination part
221 Diffusion electrode layer
222 Moth-eye layer
223 Pad electrode
224 Dielectric multilayer film
226 Al layer
227 P-side electrode
227g Transmission moth-eye surface
227h Flat part
227i Projection part 228 N-side electrode
330 First mask layer
330a Opening
332 Resist layer
332a Opening
334 Stencil mask
334a Opening
336 Second mask layer

The invention claimed is:

1. An LED element comprising:
a semiconductor lamination part that includes a light-emitting layer;
a diffractive surface on which light emitted from the light-emitting layer is incident and on which projection parts are formed with a period larger than an optical wavelength of the light and smaller than a coherence length of the light and which reflects the incident light in a plurality of modes according to a Bragg diffraction condition and transmits the incident light in a plurality of modes according to the Bragg diffraction condition; and
a reflecting surface that reflects light refracted by the diffractive surface so that the reflected light is incident on the diffractive surface again, wherein
the semiconductor lamination part is formed on the diffractive surface without any void around the projection parts,
a proportion of a flat part in the diffractive surface is 40% or more in a plan view thereof,
the light-emitting layer emits blue light,
the projection parts are disposed at the intersections of virtual triangular or rectangular lattices in a plan view thereof, and
the triangles or rectangles that form the virtual triangular or rectangular lattice do not have a regular polygonal shape and the length of each side is larger than twice the optical wavelength of the blue light and smaller than the coherence length.

2. The LED element according to claim 1, wherein
the projection parts are disposed at the intersections of virtual triangular lattices, and
the length of one side of triangles that form the virtual triangular lattice is twice or more than the optical wavelength of the blue light and is 460 nm or smaller or between 550 nm and 800 nm.

3. The LED element according to claim 2, wherein
the triangles that form the virtual triangular lattice are isosceles triangles.

4. The LED element according to claim 3, wherein
the length of one of equilateral sides and a bottom side of the isosceles triangle is twice or more than the optical wavelength of the blue light and is 460 nm or smaller or between 550 nm and 800 nm.

5. The LED element according to claim 4, wherein
a front surface of the sapphire substrate forms a verticalizing moth-eye surface in which the projection parts are disposed with a period larger than twice the optical wavelength of the blue light and smaller than the coherence length,
the verticalizing moth-eye surface is configured to reflect and transmit light incident on the verticalizing moth-eye surface from the semiconductor lamination part side,
in an angle range exceeding a critical angle, an intensity distribution of the light extracted by reflection from the verticalizing moth-eye surface at the semiconductor lamination part side is inclined closer to a direction vertical to an interface between the semiconductor lamination part and the sapphire substrate than an intensity distribution of the light incident on the verticalizing moth-eye surface at the semiconductor lamination part side,
in an angle range exceeding the critical angle, an intensity distribution of the light extracted by transmission from the verticalizing moth-eye surface at the sapphire substrate side is inclined closer to the direction vertical to the interface than an intensity distribution of the light incident on the verticalizing moth-eye surface at the semiconductor lamination part side,
the LED element includes a reflecting portion that reflects light having transmitted through the verticalizing moth-eye surface,
the LED element includes a transmissive moth-eye surface having depression parts or projection parts formed with a period smaller than twice the optical wavelength of the light emitted from the light-emitting layer, and
the light of which the intensity distribution is adjusted so as to be inclined closer to the direction vertical to the interface by reflection and transmission at the verticalizing moth-eye surface is extracted outside the element in a state where the Fresnel reflection at the transmissive moth-eye surface is suppressed.

6. The LED element according to claim 5, wherein
reflectivity of the reflecting portion increases as an angle comes closer to the direction vertical to the interface.

7. The LED element according to claim 6, further comprising:
an electrode formed on the semiconductor lamination part, wherein
the electrode includes a diffusion electrode layer formed on the semiconductor lamination part and a moth-eye layer which is formed on the diffusion electrode layer and of which the front surface forms the transmissive moth-eye surface having depression parts or projection parts formed with a period smaller than twice the optical wavelength of the light emitted from the light-emitting layer, and
the moth-eye layer is formed of a material which has a smaller extinction coefficient than a material that forms the diffusion electrode layer with respect to the light emitted from the light-emitting layer and has approximately the same index of refraction as the material that forms the diffusion electrode layer.

8. The LED element according to claim 7, wherein
the diffusion electrode layer is formed of ITO, and
the moth-eye layer is formed of $ZrO_2$.

9. A method of manufacturing the LED element according to claim 1,
forming a mask layer on a front surface of a sapphire substrate;
forming a resist film on the mask layer;
forming a predetermined pattern on the resist film;
etching the mask layer using the resist film as a mask;
etching the sapphire substrate using the etched mask layer as a mask to form the projection parts; and
forming the semiconductor lamination part on the etched front surface of the sapphire substrate.

10. The method of manufacturing the LED element according to claim 9, wherein
the mask layer includes a metal mask and a size at a base end of the projection part is controlled according to a thickness of the metal mask.

11. An LED element comprising:
a sapphire substrate; and a semiconductor lamination part including a light-emitting layer that is formed on a front surface of the sapphire substrate so as to emit blue light, wherein the front surface of the sapphire substrate has a plurality of depression parts or projection parts disposed at the intersections of virtual triangular or rectangular lattices in a plan view thereof, and the triangles or rectangles that form the virtual triangular or rectangular lattice do not have a regular polygonal shape and the length of each side is larger than twice the optical wavelength of the blue light and smaller than the coherence length.

12. The LED element according to claim 11, wherein
the depression parts or projection parts are disposed at the intersections of virtual triangular lattices, and
the length of one side of triangles that form the virtual triangular lattice is twice or more than the optical wavelength of the blue light and is 460 nm or smaller or between 550 nm and 800 nm.

13. The LED element according to claim 12, wherein
the triangles that form the virtual triangular lattice are isosceles triangles.

14. The LED element according to claim 13, wherein
the length of one of equilateral sides and a bottom side of the isosceles triangle is twice or more than the optical wavelength of the blue light and is 460 nm or smaller or between 550 nm and 800 nm.

15. The LED element according to claim 11, wherein
a front surface of the sapphire substrate forms a verticalizing moth-eye surface in which the depression parts or projection parts are disposed with a period larger than twice the optical wavelength of the blue light and smaller than the coherence length, the verticalizing moth-eye surface is configured to reflect and transmit light incident on the verticalizing moth-eye surface from the semiconductor lamination part side, in an angle range exceeding a critical angle, an intensity distribution of the light extracted by reflection from the verticalizing moth-eye surface at the semiconductor lamination part side is inclined closer to a direction vertical to an interface between the semiconductor lamination part and the sapphire substrate than an intensity distribution of the light incident on the verticalizing moth-eye surface at the semiconductor lamination part side, in an angle range exceeding the critical angle, an intensity distribution of the light extracted by transmission from the verticalizing moth-eye surface at the sapphire substrate side is inclined closer to the direction vertical to the interface than an intensity distribution of the light incident on the verticalizing moth-eye surface at the semiconductor lamination part side, the LED element includes a reflecting portion that reflects light having transmitted through the verticalizing moth-eye surface, the LED element includes a transmissive moth-eye surface having depression parts or projection parts formed with a period smaller than twice the optical wavelength of the light emitted from the light-emitting layer, and the light of which the intensity distribution is adjusted so as to be inclined closer to the direction vertical to the interface by reflection and transmission at the verticalizing moth-eye surface is extracted outside the element in a state where the Fresnel reflection at the transmissive moth-eye surface is suppressed.

16. The LED element according to claim 15, wherein
reflectivity of the reflecting portion increases as an angle comes closer to the direction vertical to the interface.

* * * * *